(12) United States Patent
Iwakaji et al.

(10) Patent No.: US 11,715,776 B2
(45) Date of Patent: *Aug. 1, 2023

(54) SEMICONDUCTOR DEVICE AND SEMICONDUCTOR CIRCUIT

(71) Applicants: Kabushiki Kaisha Toshiba, Tokyo (JP); Toshiba Electronic Devices & Storage Corporation, Tokyo (JP)

(72) Inventors: Yoko Iwakaji, Meguro (JP); Tomoko Matsudai, Shibuya (JP); Keiko Kawamura, Yokohama (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/339,204

(22) Filed: Jun. 4, 2021

(65) Prior Publication Data
US 2021/0296459 A1 Sep. 23, 2021

Related U.S. Application Data

(63) Continuation of application No. 16/791,679, filed on Feb. 14, 2020, now Pat. No. 11,063,130.

(30) Foreign Application Priority Data

Sep. 20, 2019 (JP) .................................. 2019-171100

(51) Int. Cl.
*H01L 29/423* (2006.01)
*H01L 29/06* (2006.01)
*H01L 29/739* (2006.01)

(52) U.S. Cl.
CPC ...... *H01L 29/4236* (2013.01); *H01L 29/0696* (2013.01); *H01L 29/42372* (2013.01); *H01L 29/7397* (2013.01)

(58) Field of Classification Search
CPC ............. H01L 29/4236; H01L 29/0696; H01L 29/42372; H01L 29/7397
(Continued)

(56) References Cited

U.S. PATENT DOCUMENTS 5,751,024 A 5/1998 Takahashi
6,040,599 A 3/2000 Takahashi
(Continued)

FOREIGN PATENT DOCUMENTS

CN 103022112 A 4/2013
CN 109524396 A 3/2019
(Continued)

*Primary Examiner* — Igwe U Anya
(74) *Attorney, Agent, or Firm* — Allen & Overy LLP

(57) ABSTRACT

According to an embodiment a semiconductor device includes a semiconductor layer including first trenches and second trenches, a first gate electrode in the first trench, a second gate electrode in the second trench, a first gate electrode pad, a second gate electrode pad, a first wiring connecting the first gate electrode pad and the first gate electrode, and a second wiring connecting the second gate electrode pad and the second gate electrode. The semiconductor layer includes a first connection trench. Two first trenches adjacent to each other are connected to each other at end portions by the first connection trench. At least one of the second trenches is provided between the two first trenches. The second gate electrode in the at least one second trench is electrically connected to the second wiring between the two first trenches.

17 Claims, 20 Drawing Sheets

(58) Field of Classification Search
USPC .......................................................... 257/330
See application file for complete search history.

(56) References Cited

U.S. PATENT DOCUMENTS

| | | | |
|---|---|---|---|
| 8,248,116 B2* | 8/2012 | Soeno | H01L 29/0834 327/108 |
| 11,063,130 B2* | 7/2021 | Iwakaji | H01L 29/42372 |
| 2005/0161768 A1 | 7/2005 | Sugiyama et al. | |
| 2013/0075141 A1 | 3/2013 | Suzuki et al. | |
| 2014/0209972 A1 | 7/2014 | Sumitomo et al. | |
| 2014/0339599 A1 | 11/2014 | Onozawa et al. | |
| 2015/0221566 A1 | 8/2015 | Ookura | |
| 2015/0295071 A1 | 10/2015 | Hikasa | |
| 2016/0336435 A1 | 11/2016 | Naito | |
| 2017/0213902 A1 | 7/2017 | Nishikawa et al. | |
| 2018/0286943 A1 | 10/2018 | Naito | |
| 2019/0088769 A1 | 3/2019 | Matsushita | |
| 2019/0296133 A1 | 9/2019 | Iwakaji et al. | |
| 2019/0296134 A1 | 9/2019 | Matsudai et al. | |
| 2020/0091326 A1 | 3/2020 | Iwakaji et al. | |
| 2020/0303525 A1 | 9/2020 | Iwakaji et al. | |

FOREIGN PATENT DOCUMENTS

| | | |
|---|---|---|
| JP | 2000-101076 A | 4/2000 |
| JP | 3288218 B2 | 6/2002 |
| JP | 4398719 B2 | 1/2010 |
| JP | 2010-109545 A | 5/2010 |
| JP | 2010-135676 A | 6/2010 |
| JP | 5014646 B2 | 8/2012 |
| JP | 2014-93486 A | 5/2014 |
| JP | 5742672 B2 | 7/2015 |
| JP | 2016-162855 A | 9/2016 |
| JP | 2016-219772 A | 12/2016 |
| JP | 2017-135245 A | 8/2017 |
| JP | 2018-182279 A | 11/2018 |
| JP | 2019-169575 A | 10/2019 |
| JP | 2020-47790 A | 3/2020 |

* cited by examiner

FIG.10 EE' CROSS SECTION

FIG.12 GG' CROSS SECTION

FIG.15 HH' CROSS SECTION

SEMICONDUCTOR DEVICE AND SEMICONDUCTOR CIRCUIT

CROSS-REFERENCE TO RELATED APPLICATION

This application is a continuation of U.S. application Ser. No. 16/791,679 filed Feb. 14, 2020. U.S. application Ser. No. 16/791,679 is based upon and claims the benefit of priority from Japanese Patent Application No. 2019-171100, filed on Sep. 20, 2019, the entire contents of which are incorporated herein by reference.

FIELD

Embodiments described herein relate generally to a semiconductor device and a semiconductor circuit.

BACKGROUND

An insulated gate bipolar transistor (IGBT) is one example of a power semiconductor device. The IGBT has, for example, a p-type collector region, an n-type drift region, and a p-type base region on a collector electrode. A trench penetrates the p-type base region and reaches the n-type drift region. A gate electrode exists in the trench. A gate insulating film interposed between the gate electrode and the trench. An n-type emitter region connected to an emitter electrode. The n-type emitter region exists at the surface of the p-type base region. The n-type emitter region is adjacent to the trench.

In the IGBT, a channel is formed in the p-type base region by applying a positive voltage (equal to or greater than a threshold voltage) to the gate electrode. Holes are injected into the n-type drift region from the collector region at the same time when electrons are injected into the n-type drift region from the n-type emitter region. Thus, currents using the electrons and holes as carriers flows between the collector electrode and the emitter electrode.

In order to reduce the on-resistance of the IGBT, it is effective to increase carrier concentration of the n-type drift region in an ON state. If the discharge of the carriers in the n-type drift region is delayed when the IGBT turns off, the turn-off time increases, and thus the switching loss increases.

Double gate driving is proposed as a method for achieving both reduction of the on-resistance and reduction of the switching loss. Double gate driving is a technology in which two gate driving system are used, and two gate driving timings are changed, and thus a switching time of the IGBT is reduced, and the switching loss is reduced. Accordingly, it is possible to achieve both reduction of the on-resistance and reduction of the switching loss.

DETAILED DESCRIPTION

Figure 1:
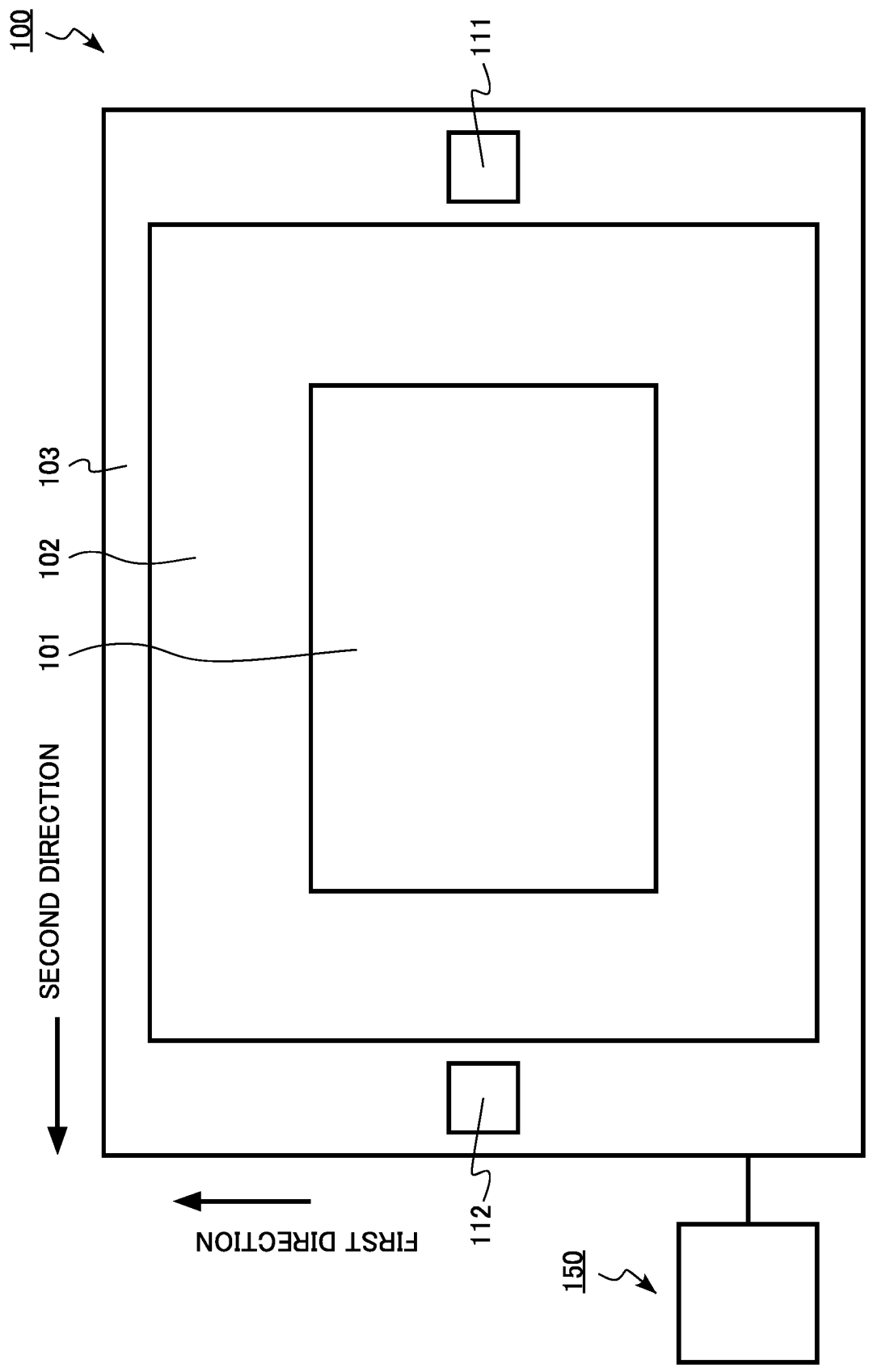
FIG. 1 is a schematic diagram illustrating a semiconductor circuit according to a first embodiment.

According to an embodiment, a semiconductor device includes a semiconductor layer including a first plane and a second plane, the first plane being parallel to a first direction and a second direction perpendicular to the first direction, and the second plane facing the first plane, and the semiconductor layer including a first semiconductor region having a first conductive type, a second semiconductor region having a second conductive type and being provided between the first semiconductor region and the first plane, a third semiconductor region having the first conductive type and being provided between the second semiconductor region and the first plane, a fourth semiconductor region having the second conductive type and being provided between the third semiconductor region and the first plane, a plurality of first trenches extending in the first direction, being repetitively disposed in the second direction, and having a distance from the second plane, the distance being smaller than a distance from the second plane to the third semiconductor region, and a plurality of second trenches extending in the first direction, being repetitively disposed in the second direction, and having a distance from the second plane, the distance being smaller than a distance from the second plane to the third semiconductor region; a first gate electrode provided in each of the first trenches; a first gate insulating film provided between the first gate electrode and the third semiconductor region and between the first gate electrode and the fourth semiconductor region, the first gate insulating film being in contact with the fourth semiconductor region; a second gate electrode provided in each of the second trenches; a second gate insulating film provided between the second gate electrode and the third semiconductor region; a first electrode provided on the first plane side of the semiconductor layer, the first electrode being electrically connected to the fourth semiconductor region; a second electrode provided on the second plane side of the semiconductor layer, the second electrode being electrically connected to the first semiconductor region; a first gate electrode pad provided on the first plane side of the semiconductor layer, a first gate voltage being applied to the first gate electrode pad; a second gate electrode pad provided on the first plane side of the semiconductor layer, a second gate voltage being applied to the second gate electrode pad; a first wiring electrically connecting the first gate electrode pad and the first gate electrode; and a second wiring electrically connecting the second gate electrode pad and the second gate electrode, wherein the semiconductor layer includes a first connection trench, two of the first trenches adjacent to each other are connected to each other at end portions by the first connection trench, at least one of the second trenches is provided between the two of the first trenches, and the second gate electrode in the at least one of the second trenches is electrically connected to the second wiring at a first position between the two of the first trenches.

Hereinafter, embodiments of the disclosure will be described with reference to the drawings. In the following descriptions, the same or similar members and the like are denoted by the same reference signs, and descriptions of a member which has been described once will be appropriately omitted.

In this specification, descriptions of an $n^+$ type, an n-type, and an $n^-$ type mean that the n-type impurity concentration is reduced in order of the $n^+$ type, the n-type, and the $n^-$ type. Descriptions of a $p^+$ type, a p-type, and a $p^-$ type mean that the p-type impurity concentration is reduced in order of the $p^+$ type, the p-type, and the $p^-$ type.

In this specification, the distribution and the absolute value of the impurity concentration in a semiconductor region may be measured, for example, using secondary ion mass spectrometry (SIMS). The relative magnitude relation in impurity concentration between two semiconductor regions may be determined, for example, using scanning capacitance microscopy (SCM). The distribution and the absolute value of the impurity concentration may be measured, for example, using a spreading resistance analysis (SRA). The relative magnitude relation and the absolute value of the carrier concentration in the semiconductor region are obtained by the SCM and the SRA. By assuming an activation rate of impurities, the relative magnitude relation in impurity concentration between two semiconductor regions, the distribution of the impurity concentration, and the absolute value of the impurity concentration may be obtained from measurement results of the SCM and the SRA.

First Embodiment

According to a first embodiment, a semiconductor device includes a semiconductor layer including a first plane and a second plane, the first plane being parallel to a first direction and a second direction perpendicular to the first direction, and the second plane facing the first plane, and the semiconductor layer including a first semiconductor region having a first conductive type, a second semiconductor region having a second conductive type and being provided between the first semiconductor region and the first plane, a third semiconductor region having the first conductive type and being provided between the second semiconductor region and the first plane, a fourth semiconductor region having the second conductive type and being provided between the third semiconductor region and the first plane, a plurality of first trenches extending in the first direction, being repetitively disposed in the second direction, and having a distance from the second plane, the distance being smaller than a distance from the second plane to the third semiconductor region, and a plurality of second trenches extending in the first direction, being repetitively disposed in the second direction, and having a distance from the second plane, the distance being smaller than a distance from the second plane to the third semiconductor region; a first gate electrode provided in each of the first trenches; a first gate insulating film provided between the first gate electrode and the third semiconductor region and between the first gate electrode and the fourth semiconductor region, the first gate insulating film being in contact with the fourth semiconductor region; a second gate electrode provided in each of the second trenches; a second gate insulating film provided between the second gate electrode and the third semiconductor region; a first electrode provided on the first plane side of the semiconductor layer, the first electrode being electrically connected to the fourth semiconductor region; a second electrode provided on the second plane side of the semiconductor layer, the second electrode being electrically connected to the first semiconductor region; a first gate electrode pad provided on the first plane side of the semiconductor layer, a first gate voltage being applied to the first gate electrode pad; a second gate electrode pad provided on the first plane side of the semiconductor layer, a second gate voltage being applied to the second gate electrode pad; a first wiring electrically connecting the first gate electrode pad and the first gate electrode; and a second wiring electrically connecting the second gate electrode pad and the second gate electrode, wherein the semiconductor layer includes a first connection trench, two of the first trenches adjacent to each other are connected to each other at end portions by the first connection trench, at least one of the second trenches is provided between the two of the first trenches, and the second gate electrode in the at least one of the second trenches is electrically connected to the second wiring at a first position between the two of the first trenches.

According to the first embodiment, a semiconductor circuit includes the semiconductor device and a control circuit configured to drive the semiconductor device and to change the second gate voltage from a first voltage to a second voltage before the first gate voltage is changed from a turn-on voltage to a turn-off voltage, the second voltage being a negative voltage when the first conductive type is a p-type and being a positive voltage when the first conductive type is an n-type.

According to the first embodiment, the semiconductor circuit includes the semiconductor device and the control circuit that controls the semiconductor device.

FIG. 1 is a schematic diagram illustrating the semiconductor circuit according to the first embodiment. In the first embodiment, the semiconductor circuit includes an IGBT 100 and a gate driver circuit 150. The IGBT 100 is an example of the semiconductor device. The gate driver circuit 150 is an example of the control circuit.

The IGBT 100 is a trench gate type IGBT including a gate electrode in a trench formed in a semiconductor layer. The IGBT 100 is capable of double gate driving. A case where the first conductive type is a p-type, and the second conductive type is an n-type will be described below as an example.

The IGBT 100 includes a cell region 101, a cell end region 102, a termination region 103, a main gate electrode pad (first gate electrode pad) 111, and a control gate electrode pad (second gate electrode pad) 112.

The cell end region 102 is provided around the cell region 101. The cell end region 102 is provided to be adjacent to the cell region 101. The termination region 103 is provided around the cell region 101 and the cell end region 102.

The cell region 101 has the main function of causing a current to flow when the IGBT 100 is in an ON state. The cell end region 102 has a function of reducing current concentration when the IGBT 100 performs a turn-off operation. The cell end region 102 has, for example, a structure of electrically connecting a main gate electrode 51 in the cell region 101 to the main gate electrode pad 111 or electrically connecting a control gate electrode 52 in the cell region 101 to the control gate electrode pad 112. The termination region 103 has a function of suppressing a decrease in a breakdown voltage of the IGBT 100 when the IGBT 100 is in an OFF state, that is, is reversely biased. For example, a guard ring (not illustrated) is provided in the termination region 103.

Figure 2:
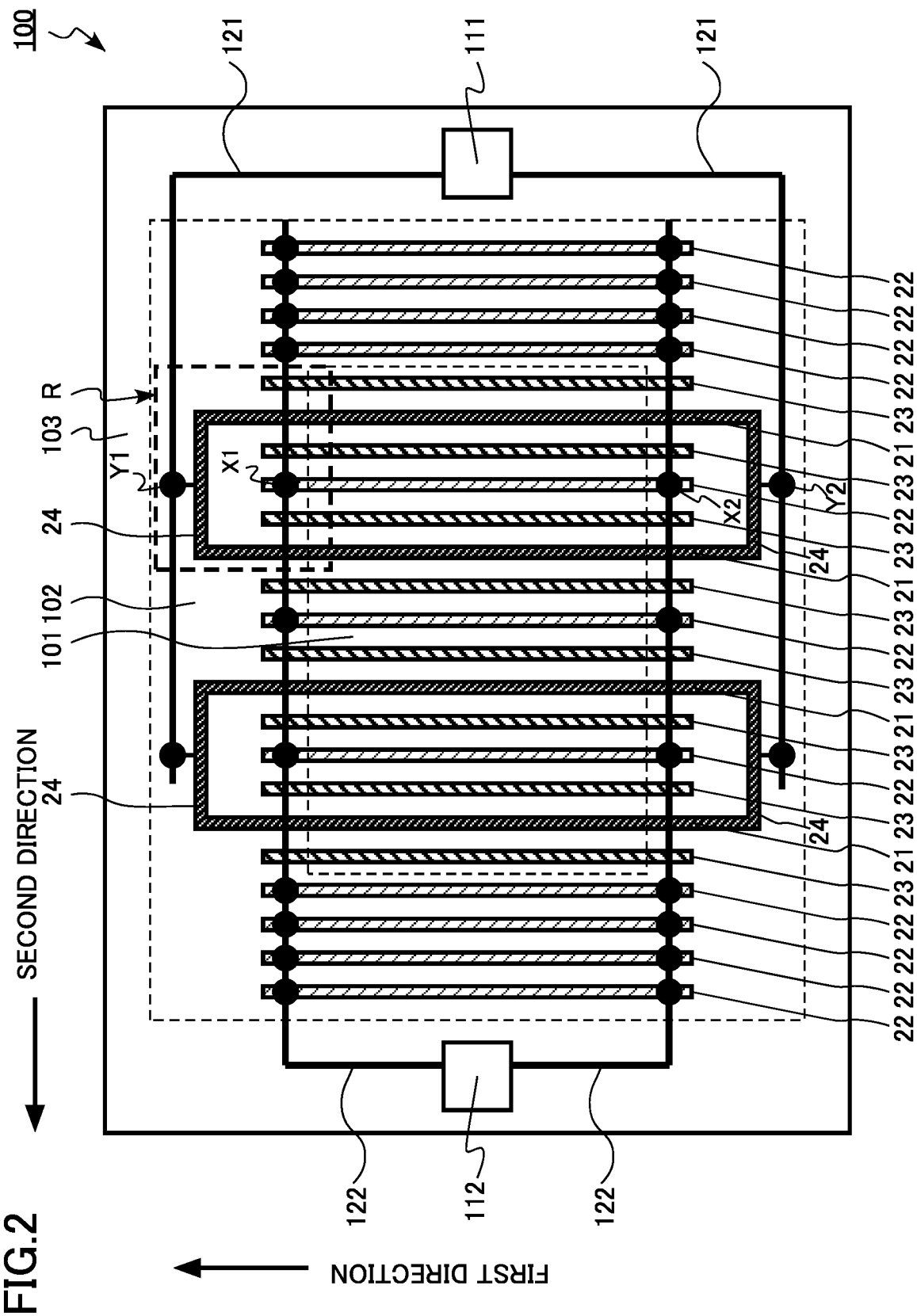
FIG. 2 is a schematic diagram illustrating a semiconductor device in the first embodiment.

FIG. 2 is a schematic diagram illustrating the semiconductor device in the first embodiment. FIG. 2 illustrates a positional relation and a connection relation between the first trench, the second trench, the first gate electrode pad, the second gate electrode pad, the first wiring, and the second wiring.

Figure 3:
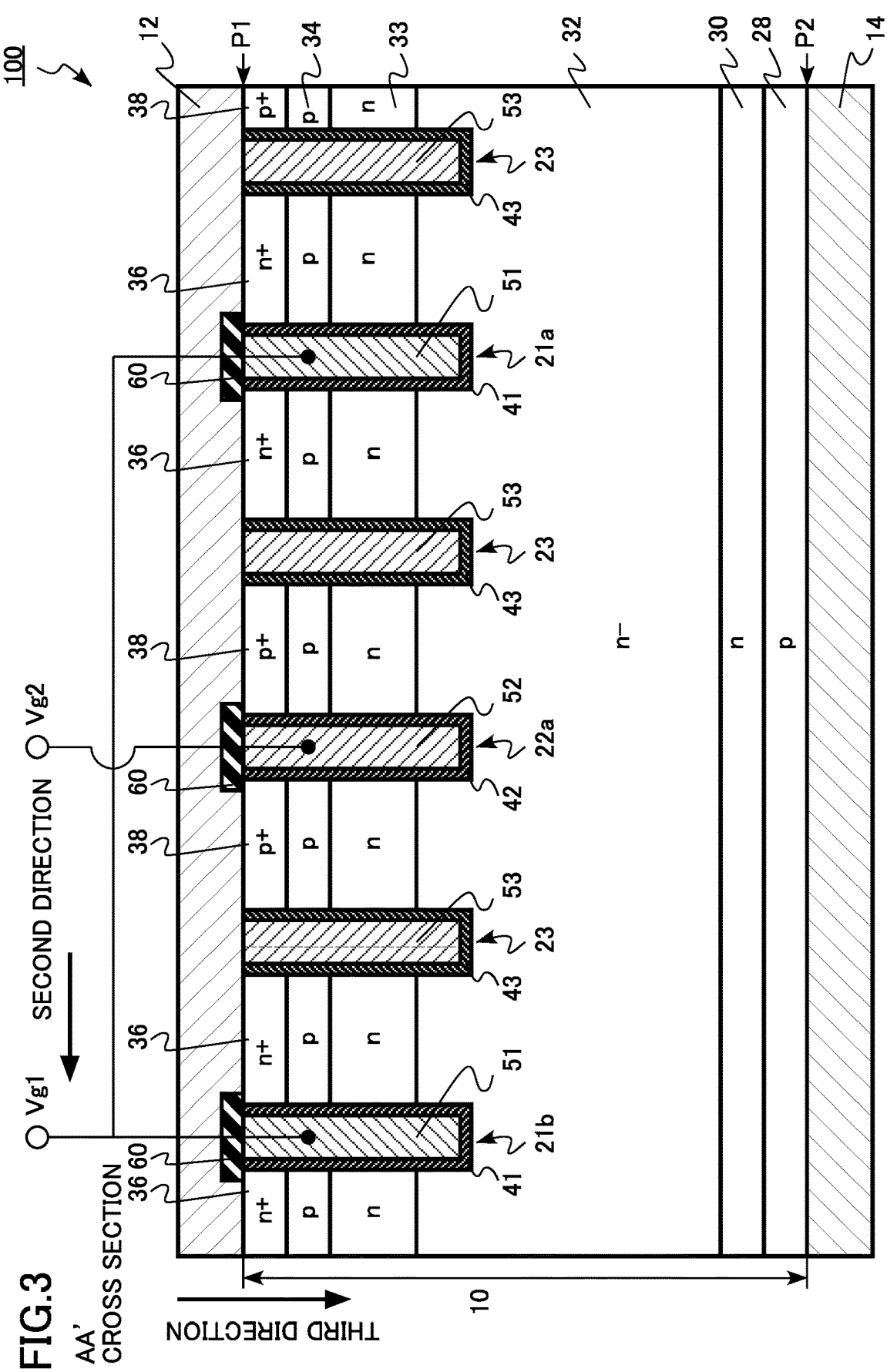
FIG. 3 is a cross-sectional view schematically illustrating a portion of the semiconductor device in the first embodiment.
Figure 4:
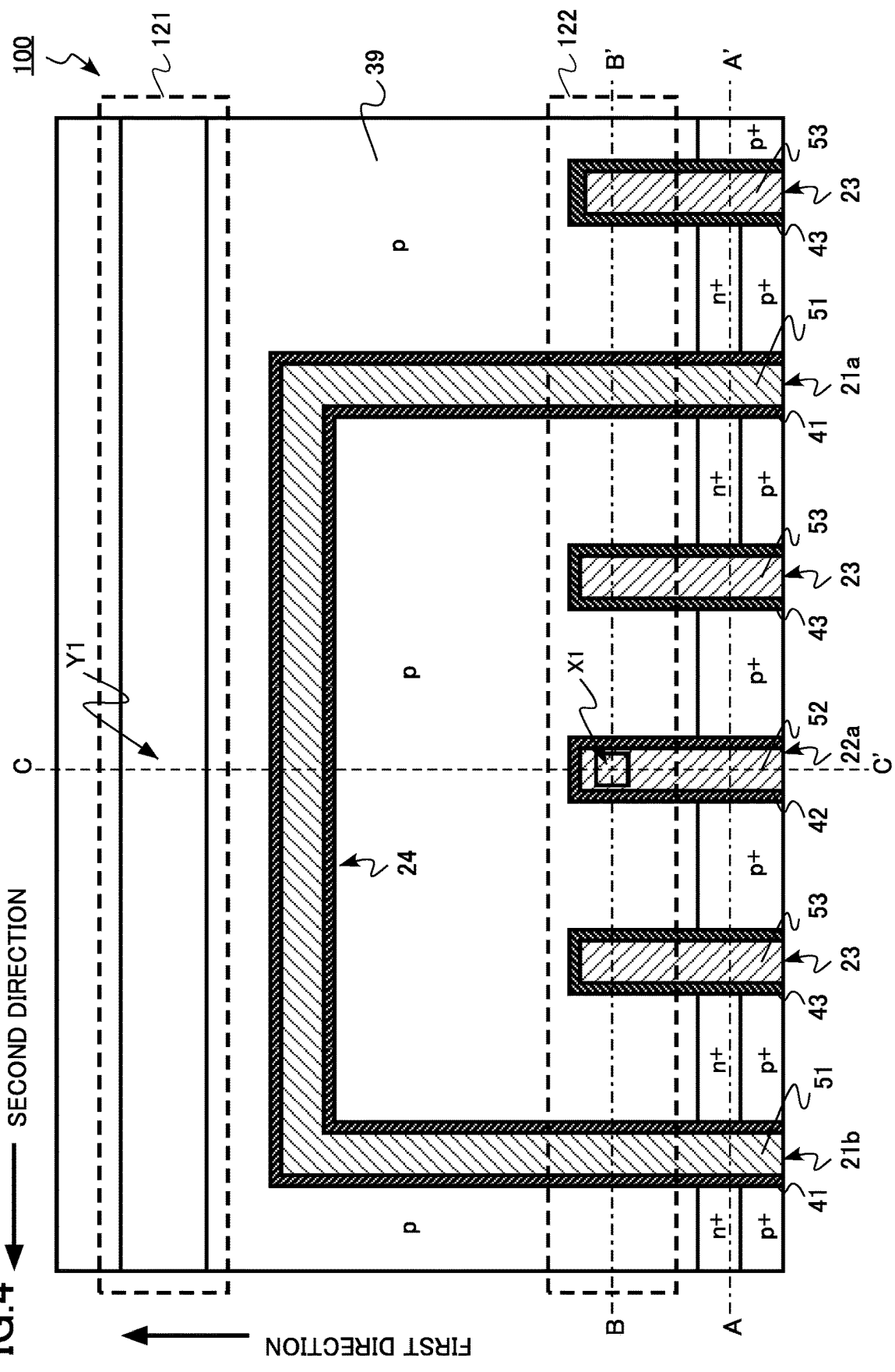
FIG. 4 is a top view schematically illustrating the portion of the semiconductor device in the first embodiment.
Figure 5:
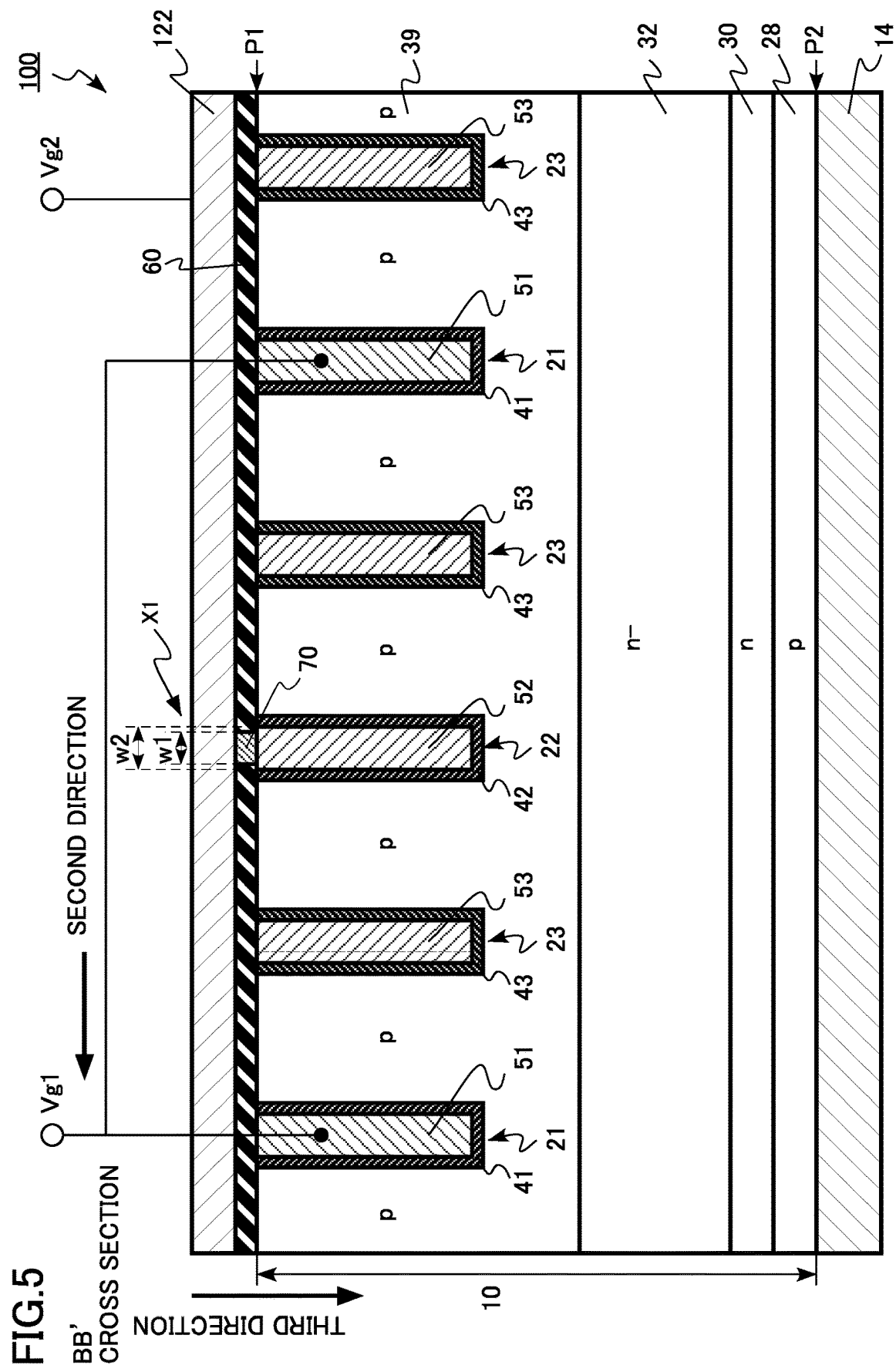
FIG. 5 is a cross-sectional view schematically illustrating the portion of the semiconductor device in the first embodiment.
Figure 6:
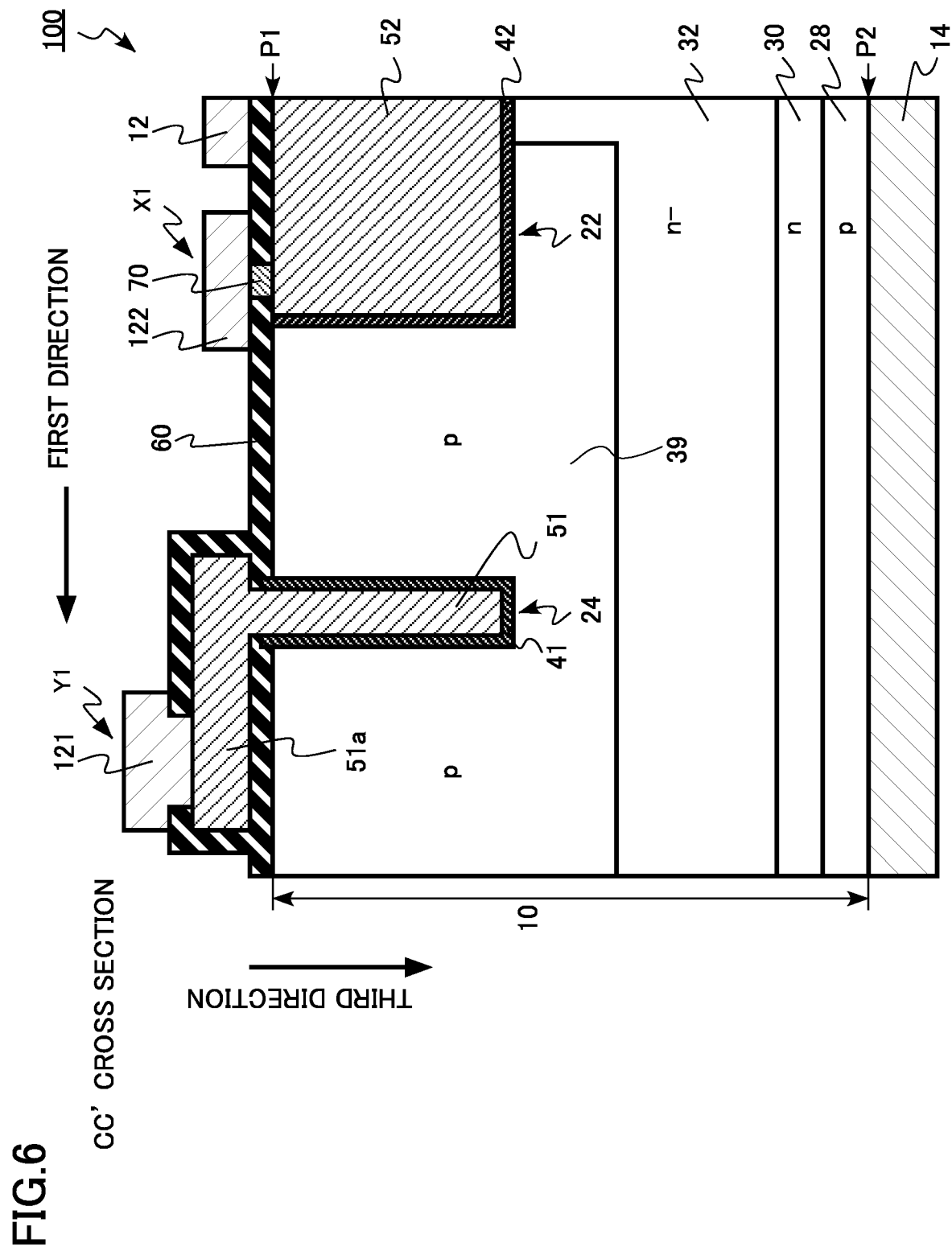
FIG. 6 is a cross-sectional view schematically illustrating the portion of the semiconductor device in the first embodiment.

FIG. 3 is a cross-sectional view schematically illustrating a portion of the semiconductor device in the first embodiment. FIG. 4 is a top view schematically illustrating the portion of the semiconductor device in the first embodiment. FIG. 5 is a cross-sectional view schematically illustrating the portion of the semiconductor device in the first embodiment. FIG. 6 is a cross-sectional view schematically illustrating the portion of the semiconductor device in the first embodiment.

FIGS. 3 to 6 are enlarged view illustrating a region R surrounded by a dotted frame in FIG. 2. The region R includes a boundary region between the cell region 101 and the cell end region 102.

FIG. 3 illustrates a cross-section taken long line AA' in FIG. 4. FIG. 3 illustrates a cross-section of the cell region 101.

FIG. 5 illustrates a cross-section taken long line BB' in FIG. 4. FIG. 5 illustrates a cross-section of the cell end region 102.

FIG. 6 illustrates a cross-section taken long line CC' in FIG. 4. FIG. 6 illustrates a cross-section of the cell region 101 and the cell end region 102.

FIGS. 2 and 4 are top views illustrating a first plane P1 of the semiconductor layer 10.

In the first embodiment, the IGBT 100 includes a semiconductor layer 10, an emitter electrode (first electrode) 12, a collector electrode (second electrode) 14, a main gate insulating film (first gate insulating film) 41, a control gate insulating film (second gate insulating film) 42, a dummy gate insulating film 43, a main gate electrode (first gate electrode) 51, a control gate electrode (second gate electrode) 52, a dummy gate electrode 53, an interlayer insulating layer 60, a contact plug (conductive layer) 70, a main gate electrode pad (first gate electrode pad) 111, a control gate electrode pad (second gate electrode pad) 112, a main gate wiring (first wiring) 121, and a control gate wiring (second wiring) 122.

In the semiconductor layer 10, a main gate trench (first trench) 21, a control gate trench (second trench) 22, a dummy gate trench 23, a first connection trench 24, a collector region (first semiconductor region) 28, a buffer region 30, a drift region (second semiconductor region) 32, a barrier region 33, a base region (third semiconductor region) 34, an emitter region (fourth semiconductor region) 36, a collector region 38, and a deep region (fifth semiconductor region) 39 are provided.

The semiconductor layer 10 includes the first plane P1 and a second plane P2 facing the first plane P1. The semiconductor layer 10 is made of single crystal silicon, for example.

In this specification, a direction parallel to the first plane P1 is referred to as a first direction. A direction which is parallel to the first plane P1 and is perpendicular to the first direction is referred to as a second direction. A normal direction of the first plane P1 is referred to as a third direction. In this specification, "a depth" is defined as a distance in the third direction using the first plane P1 as a reference.

The emitter electrode 12 is provided on the first plane P1 side of the semiconductor layer 10. At least a portion of the emitter electrode 12 is in contact with the first plane P1 of the semiconductor layer 10. The emitter electrode 12 is made of metal, for example.

The emitter electrode 12 is electrically connected to the emitter region 36 and the collector region 38. An emitter voltage is applied to the emitter electrode 12. The emitter voltage is 0 V, for example.

The collector electrode 14 is provided on the second plane P2 side of the semiconductor layer 10. At least a portion of the collector electrode 14 is in contact with the second plane P2 of the semiconductor layer 10. The collector electrode 14 is made of metal, for example.

The collector electrode 14 is electrically connected to the p-type collector region 28. A collector voltage is applied to the collector electrode 14. The collector voltage is, for example, equal to or greater than 200 V and equal to or smaller than 6500 V.

The collector region 28 is a p-type semiconductor region. The collector region 28 is electrically connected to the collector electrode 14. The collector region 28 is in contact with the collector electrode 14.

The collector region 28 functions as a supply source of holes when the IGBT 100 is in the ON state.

The buffer region 30 is an n-type semiconductor region. The buffer region 30 is provided between the collector region 28 and the first plane P1. The buffer region 30 has a function of suppressing extension of a depletion layer when the IGBT 100 is in the OFF state. A configuration in which the buffer region 30 is not provided may be made.

The drift region 32 is an n⁻ type semiconductor region. The drift region 32 is provided between the collector region 28 and the first plane P1. The drift region 32 is provided between the buffer region 30 and the first plane P1. The n-type impurity concentration of the drift region 32 is lower than the n-type impurity concentration of the buffer region 30.

The drift region 32 functions as a path of an on-current when the IGBT 100 is in the ON state. The drift region 32 has a function of depleting when the IGBT 100 is in the OFF state and maintaining the breakdown voltage of the IGBT 100.

The barrier region 33 is an n-type semiconductor region. The barrier region 33 is provided between the drift region 32 and the first plane P1. The barrier region 33 is provided between the drift region 32 and the base region 34. The n-type impurity concentration of the barrier region 33 is higher than the n-type impurity concentration of the drift region 32.

Since the barrier region 33 having the n-type impurity concentration higher than the n-type impurity concentration of the drift region 32 is provided on the first plane P1 side, the discharge of holes in the drift region 32 to the emitter electrode 12 when the IGBT 100 is in the ON state is restricted. Thus, the carrier concentration on the first plane P1 side of the drift region increases. Accordingly, the barrier region 33 has a function of reducing the on-resistance of the IGBT 100.

The drift region 32 and the barrier region 33 are similarly n-type impurity regions. The n-type impurity concentration continuously increases from the drift region 32 toward the barrier region 33.

A configuration in which the barrier region 33 is not provided may be made.

The base region 34 is a p-type semiconductor region. The base region 34 is provided between the drift region 32 and the first plane P1. The base region 34 is provided between the barrier region 33 and the first plane P1.

An inversion layer is formed in a region of the base region 34, which faces the main gate electrode 51, when the IGBT 100 is in the ON state. The base region 34 has a function as a channel region of a transistor.

The emitter region 36 is an n$^+$ type semiconductor region. The emitter region 36 is provided between the base region 34 and the first plane P1. The emitter region 36 extends in the first direction in the first plane P1.

The emitter region 36 is in contact with the main gate insulating film 41. The emitter region 36 is spaced from the control gate insulating film 42. The emitter region 36 is not in contact with the control gate insulating film 42. The n-type impurity concentration of the emitter region 36 is higher than the n-type impurity concentration of the drift region 32.

The emitter region 36 is electrically connected to the emitter electrode 12. The emitter region 36 is in contact with the emitter electrode 12. The emitter region 36 functions as a supply source of electrons when a transistor including the main gate electrode 51 is in the ON state.

The collector region 38 is a p$^+$ type semiconductor region. The collector region 38 is provided between the base region 34 and the first plane P1. The collector region 38 extends in the first direction in the first plane P1. The collector region 38 is electrically connected to the emitter electrode 12.

The deep region 39 is a p-type semiconductor region. The deep region 39 is provided between the drift region 32 and the first plane P1. The depth of the deep region 39 is deeper than the depth of the base region 34. The depth of the deep region 39 is deeper than the depths of the main gate trench 21, the control gate trench 22, and the dummy gate trench 23, for example.

The deep region 39 is provided in the cell end region 102 or the termination region 103. The deep region 39 has, for example, a function of reducing electric field strength of the cell end region 102 or the termination region 103.

The deep region 39 is provided between the first connection trench 24 and the drift region 32. The deep region 39 is provided just under the first connection trench 24.

As illustrated in FIG. 2, the main gate trench 21 extends in the first direction parallel to the first plane P1, in the first plane P1. The main gate trench 21 has a stripe shape. A plurality of main gate trenches 21 are repetitively disposed in the second direction perpendicular to the first direction. The main gate trench 21 is a groove formed in the semiconductor layer 10.

The main gate trench 21 penetrates the base region 34 and the barrier region 33 and then reaches the drift region 32. A distance of the main gate trench 21 from the second plane P2 is smaller than a distance from the second plane P2 to the base region 34.

As illustrated in FIG. 2, two main gate trenches 21 which are adjacent to each other and are selected from the main gate trenches 21 are connected to each other at both end portions of the main gate trenches by the first connection trench 24. For example, as illustrated in FIG. 4, a main gate trench 21a and a main gate trench 21b are connected to each other by the first connection trench 24 in the region R including the end portion of the cell region 101 in the first direction. The main gate trench 21a and the main gate trench 21b are similarly connected to each other at the end portion of the cell region 101 on an opposite side of the first direction, by the first connection trench 24.

A ring-like trench is formed by the main gate trench 21a, the main gate trench 21b, and the first connection trench 24. Since both end portions of the two main gate trenches 21 adjacent to each other are connected to each other, the electric field strength at the end portion of the main gate trench 21 is reduced, and a gate insulating breakdown voltage of the IGBT 100 is increased.

The main gate electrode 51 is provided in the main gate trench 21. The main gate electrode 51 is made of a semiconductor or metal, for example. The main gate electrode 51 is made of amorphous silicon or polycrystalline silicon containing n-type impurities or p-type impurities, for example. The main gate electrode 51 is electrically connected to the main gate electrode pad 111.

The main gate insulating film 41 is provided between the main gate electrode 51 and the semiconductor layer 10. The main gate insulating film 41 is provided between the main gate electrode 51 and the drift region 32, between the main gate electrode 51 and the barrier region 33, between the main gate electrode 51 and the base region 34, and between the main gate electrode 51 and the emitter region 36. The main gate insulating film 41 is in contact with the drift region 32, the barrier region 33, the base region 34, and the emitter region 36. The main gate insulating film 41 is made of silicon oxide, for example.

As illustrated in FIG. 2, the control gate trench 22 extends in the first direction parallel to the first plane P1, in the first plane P1. The control gate trench 22 has a stripe shape. A plurality of control gate trenches 22 are repetitively disposed in the second direction perpendicular to the first direction. The control gate trench 22 is a groove formed in the semiconductor layer 10.

The control gate trench 22 penetrates the base region 34 and the barrier region 33 and then reaches the drift region 32. A distance of the control gate trench 22 from the second plane P2 is smaller than the distance from the second plane P2 to the base region 34.

As illustrated in FIG. 2, at least one of the control gate trenches 22 is provided between two main gate trenches 21 which are adjacent to each other and have end portions connected to each other. For example, as illustrated in FIG. 4, a control gate trench 22a is provided between the main gate trench 21a and the main gate trench 21b having the end portions connected to each other, in the region R. The control gate trench 22a is surrounded by the ring-like trench including the main gate trench 21a and the main gate trench 21b.

The control gate electrode 52 is provided in the control gate trench 22. The control gate electrode 52 is made of a semiconductor or metal, for example. The control gate electrode 52 is made of amorphous silicon or polycrystalline silicon containing n-type impurities or p-type impurities, for example. The control gate electrode 52 is electrically connected to the control gate electrode pad 112.

The control gate insulating film 42 is provided between the control gate electrode 52 and the semiconductor layer 10. The control gate insulating film 42 is provided between the control gate electrode 52 and the drift region 32, between the control gate electrode 52 and the barrier region 33, between the control gate electrode 52 and the base region 34, and between the control gate electrode 52 and the collector region 38. The control gate insulating film 42 is in contact with the drift region 32, the barrier region 33, and the base region 34. The control gate insulating film 42 is not in contact with the emitter region 36. The control gate insulating film 42 is spaced from the emitter region 36. The control gate insulating film 42 is made of silicon oxide, for example.

A configuration in which the control gate insulating film 42 is in contact with the emitter region 36 provided between the main gate trench 21 and the control gate trench 22 may be made.

As illustrated in FIG. 2, regarding a ratio of the number of control gate trenches 22 to the number of main gate trenches 21, the ratio in the cell end region 102 (first region) on the main gate electrode pad 111 side and the cell end region 102 (second region) on the control gate electrode pad 112 side located in the second direction of the cell end region 102 on the main gate electrode pad 111 side is greater than the ratio in the cell region 101 (third region). The cell region 101 is interposed between the cell end region 102 on the main gate electrode pad 111 side and the cell end region 102 on the control gate electrode pad 112 side. In other words, the ratio of the number of control gate trenches 22 to the number of main gate trenches 21 in the cell end region 102 is greater than the ratio in the cell region 101. Many control gate trenches 22 and control gate electrodes 52 are disposed in the cell end region 102 in comparison to the cell region 101.

As illustrated in FIG. 2, the dummy gate trench 23 extends in the first direction parallel to the first plane P1, in the first plane P1. The dummy gate trench 23 has a stripe shape. A plurality of dummy gate trenches 23 are repetitively disposed in the second direction perpendicular to the first direction. The dummy gate trench 23 is a groove formed in the semiconductor layer 10.

The dummy gate trench 23 penetrates the base region 34 and the barrier region 33 and then reaches the drift region 32. A distance of the dummy gate trench 23 from the second plane P2 is smaller than the distance from the second plane P2 to the base region 34.

The dummy gate electrode 53 is provided in the dummy gate trench 23. The dummy gate electrode 53 is made of a semiconductor or metal, for example. The dummy gate electrode 53 is made of amorphous silicon or polycrystalline silicon containing n-type impurities or p-type impurities, for example. The dummy gate electrode 53 is electrically connected to the emitter electrode 12.

The dummy gate insulating film 43 is provided between the dummy gate electrode 53 and the semiconductor layer 10. The dummy gate insulating film 43 is made of silicon oxide, for example.

A configuration in which the dummy gate trench 23, the dummy gate electrode 53, and the dummy gate insulating film 43 are not provided may be made.

The interlayer insulating layer 60 electrically separates the main gate electrode 51 and the emitter electrode 12 from each other and electrically separates the control gate electrode 52 and the emitter electrode 12 from each other, for example. The interlayer insulating layer 60 is made of silicon oxide, for example.

The main gate electrode pad 111 is provided on the first plane P1 side of the semiconductor layer 10. The main gate electrode pad 111 is electrically connected to the main gate electrode 51. A first gate voltage (Vg1) is applied to the main gate electrode pad 111.

The main gate wiring 121 electrically connects the main gate electrode pad 111 and the main gate electrode 51 to each other. The main gate wiring 121 is made of metal or an aluminum alloy, for example.

The main gate electrode 51 is connected to the main gate wiring 121 at an end portion of the main gate electrode 51 in the first direction. The main gate electrode 51 is connected to the main gate wiring 121 at an end portion of the main gate electrode 51 in an opposite direction of the first direction. The main gate electrode 51 is connected to the main gate wiring 121 at both end portions.

In FIG. 2, black circles on the main gate wiring 121 indicate positions at which the main gate wiring 121 is connected to the main gate electrode 51. For example, the main gate wiring 121 is connected to the main gate electrode 51 at a position (third position) Y1 in FIG. 2. The position Y1 corresponds to the end portion of the main gate electrode 51 in the first direction. For example, the main gate wiring 121 is connected to the main gate electrode 51 at a position (fourth position) Y2 in FIG. 2. The position Y2 corresponds to the end portion of the main gate electrode 51 in the opposite direction of the first direction.

The main gate wiring 121 is connected to the main gate electrode 51 on both the sides of the main gate trench 21 in the first direction and the opposite direction of the first direction.

As illustrated in FIG. 6, the main gate electrode 51 in the first connection trench 24 includes a lead region 51a. The lead region 51a is provided on the first plane P1. The main gate wiring 121 is in contact with the lead region 51a at the position (third position) Y1.

The control gate electrode pad 112 is provided on the first plane P1 side of the semiconductor layer 10. The control gate electrode pad 112 is electrically connected to the control gate electrode 52. The control gate wiring 122 is electrically connected to the control gate electrode pad 112 and the control gate electrode 52. A second gate voltage (Vg2) is applied to the control gate electrode pad 112.

The control gate wiring 122 electrically connects the control gate electrode pad 112 and the control gate electrode 52 to each other. The control gate wiring 122 is made of metal or an aluminum alloy, for example.

The control gate electrode 52 is connected to the control gate wiring 122 at an end portion of the control gate electrode 52 in the first direction. The control gate electrode 52 is connected to the control gate wiring 122 at an end portion of the control gate electrode 52 in the opposite direction of the first direction.

In FIG. 2, black circles on the control gate wiring 122 indicate positions at which the control gate wiring 122 is connected to the control gate electrode 52. The control gate electrode 52 between two main gate trenches 21 is connected to the control gate wiring 122 at a position between the two main gate trenches 21.

The control gate wiring 122 is connected to the control gate electrode 52 at a position (first position) X1 in FIG. 2, for example. The position X1 corresponds to the end portion of the control gate electrode 52 in the first direction. The control gate wiring 122 is connected to the control gate electrode 52 at a position (second position) X2 in FIG. 2, for example. The position X2 corresponds to the end portion of the control gate electrode 52 in the opposite direction of the first direction.

When the width of the control gate trench 22 in a direction perpendicular to the first direction is set as W1, a distance between the position X1 and the end of the control gate trench 22 in the first direction is equal to or smaller than 30 times the width W1, for example. When the width of the control gate trench 22 in a direction perpendicular to the first direction is set as W1, a distance between the position X2 and the end of the control gate trench 22 in the opposite direction of the first direction is equal to or smaller than 30 times the width W1, for example. The position X1 and the position X2 are more preferably provided at the end (end portion) of the control gate electrode 52 (as much as possible) in the first direction of the control gate trench 22 and the opposite direction of the first direction.

The deep region 39 is provided between the position X1 and the drift region 32. The deep region 39 is provided between the control gate trench 22 just under the position X1 and the drift region 32. The deep region 39 is provided between the contact plug 70 and the drift region 32.

The deep region 39 is provided between the position X2 and the drift region 32. The deep region 39 is provided between the control gate trench 22 just under the position X2 and the drift region 32.

As illustrated in FIG. 4, for example, the control gate electrode 52 in the control gate trench 22a is connected to the control gate wiring 122 at the position X1 between the main gate trench 21a and the main gate trench 21b. The position X1 is a position at which the control gate wiring 122 intersects with the control gate trench 22a.

As illustrated in FIGS. 5 and 6, the control gate wiring 122 is connected to the control gate electrode 52 in the control gate trench 22a by using the contact plug 70. For example, the contact plug 70 is formed by burying a hole provided in the interlayer insulating layer 60 on the control gate electrode 52.

The material of the contact plug 70 is different from the material of the control gate wiring 122, for example. As the material of the contact plug 70, for example, a material having burying ability for a small hole better than the material of the control gate wiring 122 is used. For example, the material of the control gate wiring 122 is an aluminum alloy, and the material of the contact plug 70 is tungsten.

The contact plug 70 is in contact with the control gate electrode 52. The contact plug 70 is in contact with the control gate wiring 122.

The width (w1 in FIG. 5) of the contact plug 70 in the second direction is smaller than the width (w2 in FIG. 5) of the control gate electrode 52 in the second direction.

The control gate wiring 122 intersects with the main gate trench 21.

The gate driver circuit 150 is provided in the same module as the IGBT 100 or provided on the same circuit board as the IGBT 100. The gate driver circuit 150 has a function of driving the IGBT 100.

The gate driver circuit 150 has a function of applying the desired first gate voltage (Vg1) and the desired second gate voltage (Vg2) to the main gate electrode pad 111 and the control gate electrode pad 112 at a desired timing.

The gate driver circuit 150 changes the second gate voltage (Vg2) from a first voltage to a second voltage before changing the first gate voltage (Vg1) from a turn-on voltage to a turn-off voltage. The second voltage is a negative voltage when the first conductive type is a p-type and is a positive voltage when the first conductive type is an n-type.

Next, the actions and effects of the semiconductor device in the first embodiment will be described.

In order to reduce the on-resistance of the IGBT, it is effective to increase carrier concentration of the drift region in the ON state. If the discharge of the carriers from the drift region is delayed when the IGBT turns off, the turn-off time increases, and thus the switching loss increases. Accordingly, it is desired to achieve both reduction of the on-resistance and reduction of the switching loss.

In the first embodiment, the IGBT 100 includes the main gate electrode 51 in the main gate trench 21 and the control gate electrode 52 in the control gate trench 22. The first gate voltage (Vg1) to be applied to the main gate electrode 51 and the second gate voltage (Vg2) to be applied to the control gate electrode 52 are independently controlled.

The IGBT 100 causes the second gate voltage (Vg2) to be the negative voltage before changing the first gate voltage (Vg1) from the turn-on voltage (Von) to the turn-off voltage (Voff). Since the second gate voltage (Vg2) is set to be the negative voltage, a p-type inversion layer is formed in the drift region 32 in contact with the control gate insulating film 42 and the barrier region 33 in contact with the control gate insulating film 42 (the drift region 32 and the barrier region 33 face the control gate electrode 52).

Since the second gate voltage (Vg2) is set to be the negative voltage, it is possible to form the p-type inversion layer in the barrier region 33 having the n-type impurity concentration higher than the n-type impurity concentration of the drift region 32.

Holes in the drift region 32 pass in the p-type inversion layer and are discharged to the emitter electrode 12. Thus, the accumulated amount of the carrier on the first plane P1 side of the drift region 32 is reduced.

When the first gate voltage (Vg1) is changed from the turn-on voltage (Von) to the turn-off voltage (Voff), the accumulated amount of the carrier on the first plane P1 side of the drift region 32 has been already reduced. Thus, the turn-off time becomes short. Thus, it is possible to reduce the switching loss of the IGBT 100.

Since the control gate electrode 52 is provided in addition to the main gate electrode 51, in the IGBT 100, the control gate electrode pad 112 and the control gate electrode 52 are connected to each other by the control gate wiring 122. A connection between the control gate electrode 52 and the control gate wiring 122 is performed in the cell end region 102.

In the IGBT 100 in the first embodiment, the control gate electrode 52 and the control gate wiring 122 are connected to each other at a position between the two main gate trenches 21 adjacent to each other. With such a configuration, the restriction on the connection position between the control gate electrode 52 and the control gate wiring 122 is reduced. Accordingly, the degree of freedom in pattern design of the IGBT 100 increases.

With the above configuration, it is possible to reduce the area required for the connection between the control gate electrode 52 and the control gate wiring 122. Accordingly, it is possible to reduce a chip area of the IGBT 100.

From a viewpoint of reducing a signal delay of the control gate electrode 52, the control gate electrode 52 is preferably connected to the control gate wiring 122 at both end portions.

In the IGBT 100 in the first embodiment, many control gate electrodes 52 are disposed in the cell end region 102 in comparison to the cell region 101. Thus, a hole extraction effect by the control gate electrode 52 when the IGBT 100 turns off is enhanced in the cell end region 102. Accordingly, it is possible to suppress an occurrence of a situation in which a current concentrates on the vicinity of the main gate trench 21 at the end portion of the cell region 101, and thus the IGBT 100 is broken. Thus, reliability of the IGBT 100 is improved.

According to the first embodiment, it is possible to reduce the on-resistance of the IGBT and to reduce the switching loss. The degree of freedom in pattern design of the IGBT increases. It is possible to reduce the chip area of the IGBT. An operation speed of the IGBT is increased. The reliability of the IGBT is improved.

Second Embodiment

A semiconductor device according to a second embodiment is different from the semiconductor device in the first embodiment in that the semiconductor layer includes a second connection trench, and at least one second trench and a second trench adjacent to the at least one second trench are connected to each other at end portions by the second connection trench. Some of descriptions of contents similar to the contents in the first embodiment will be omitted below.

The semiconductor device in the second embodiment is an IGBT 200. The IGBT 200 is a trench gate type IGBT including a gate electrode in a trench formed in a semiconductor layer. The IGBT 200 is capable of double gate driving.

Figure 7:
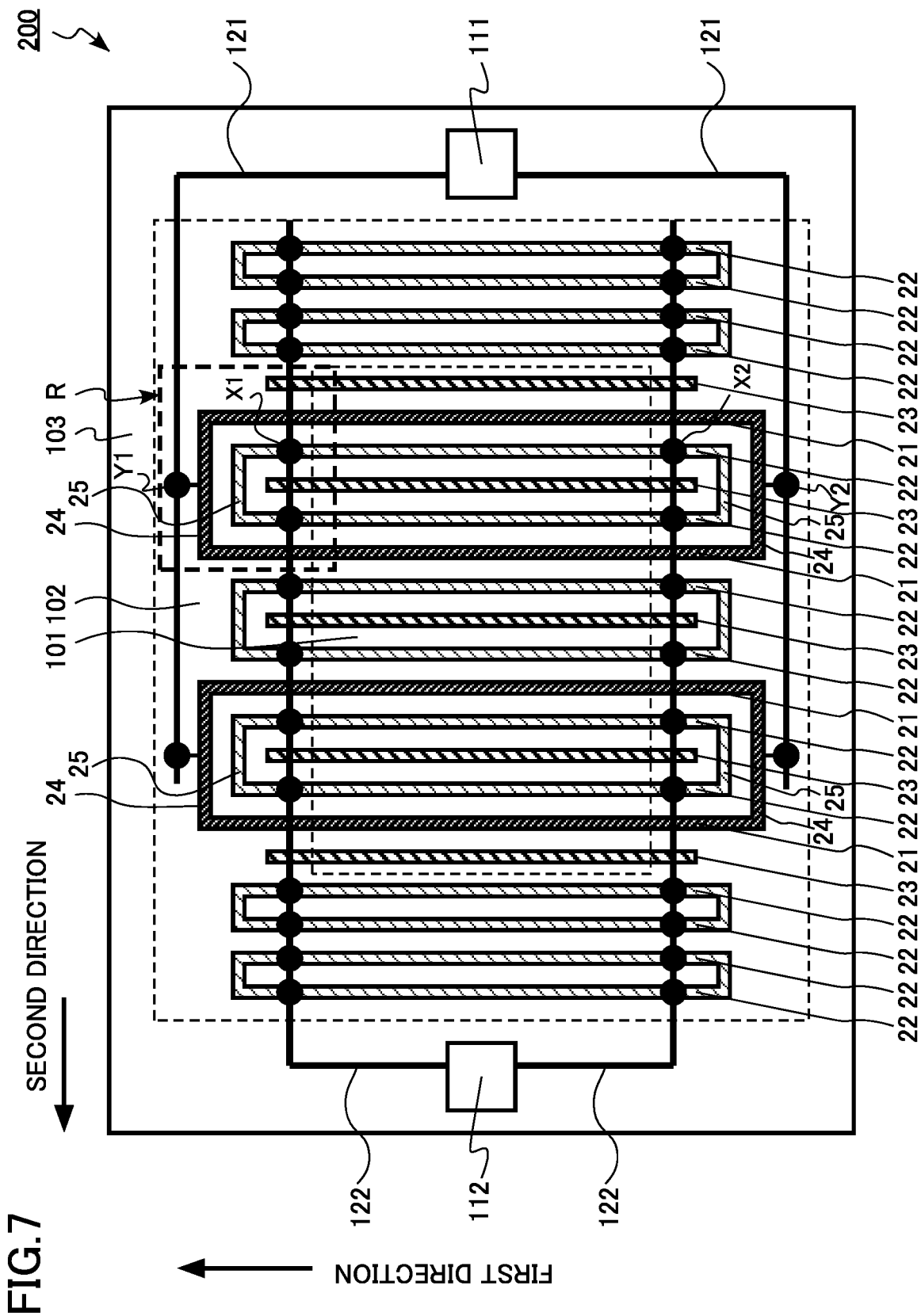
FIG. 7 is a schematic diagram illustrating a semiconductor device according to a second embodiment.

FIG. 7 is a schematic diagram illustrating the semiconductor device in the second embodiment. FIG. 7 illustrates a positional relation and a connection relation between the first trench, the second trench, the first gate electrode pad, the second gate electrode pad, the first wiring, and the second wiring.

Figure 8:
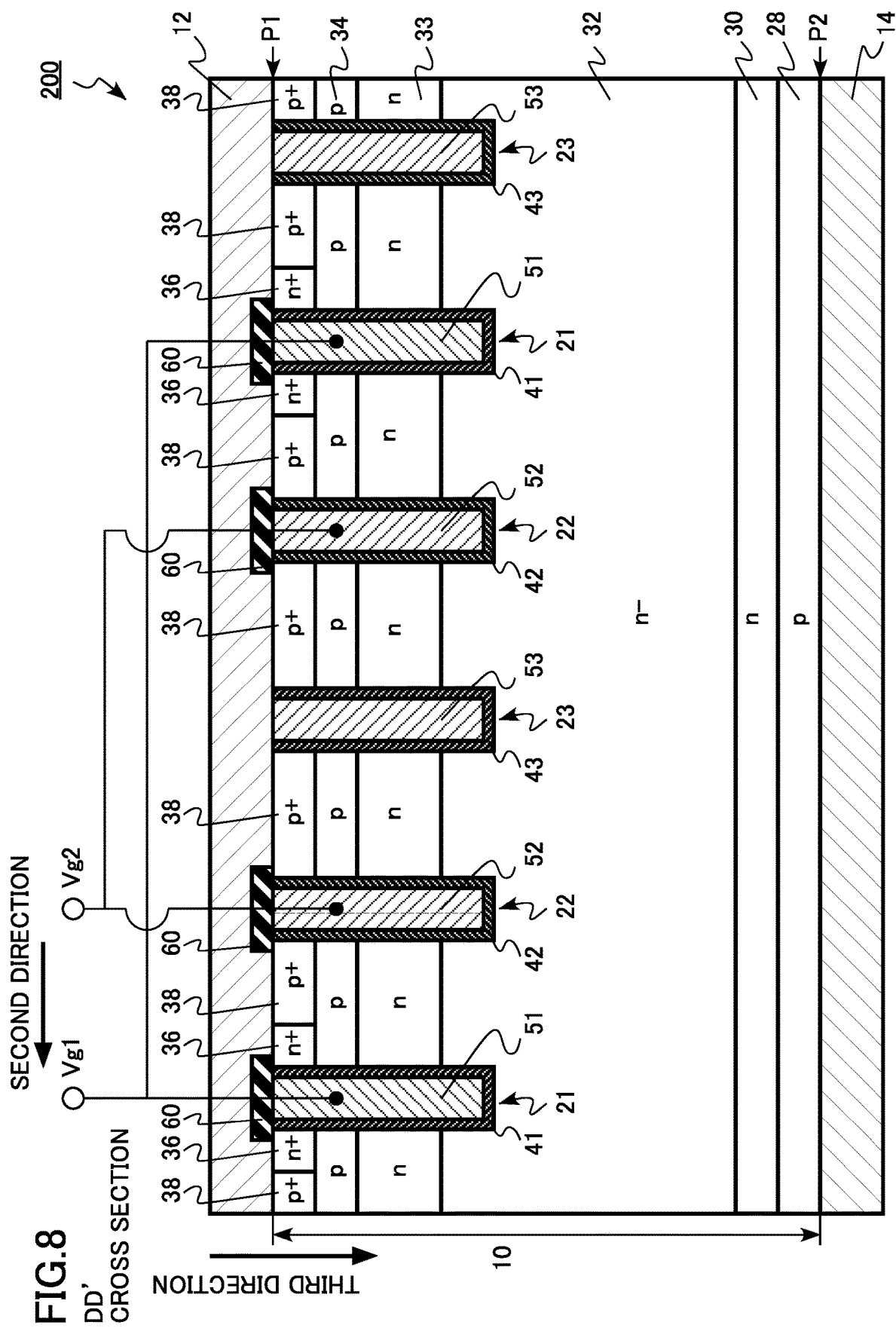
FIG. 8 is a cross-sectional view schematically illustrating a portion of the semiconductor device in the second embodiment.
Figure 9:
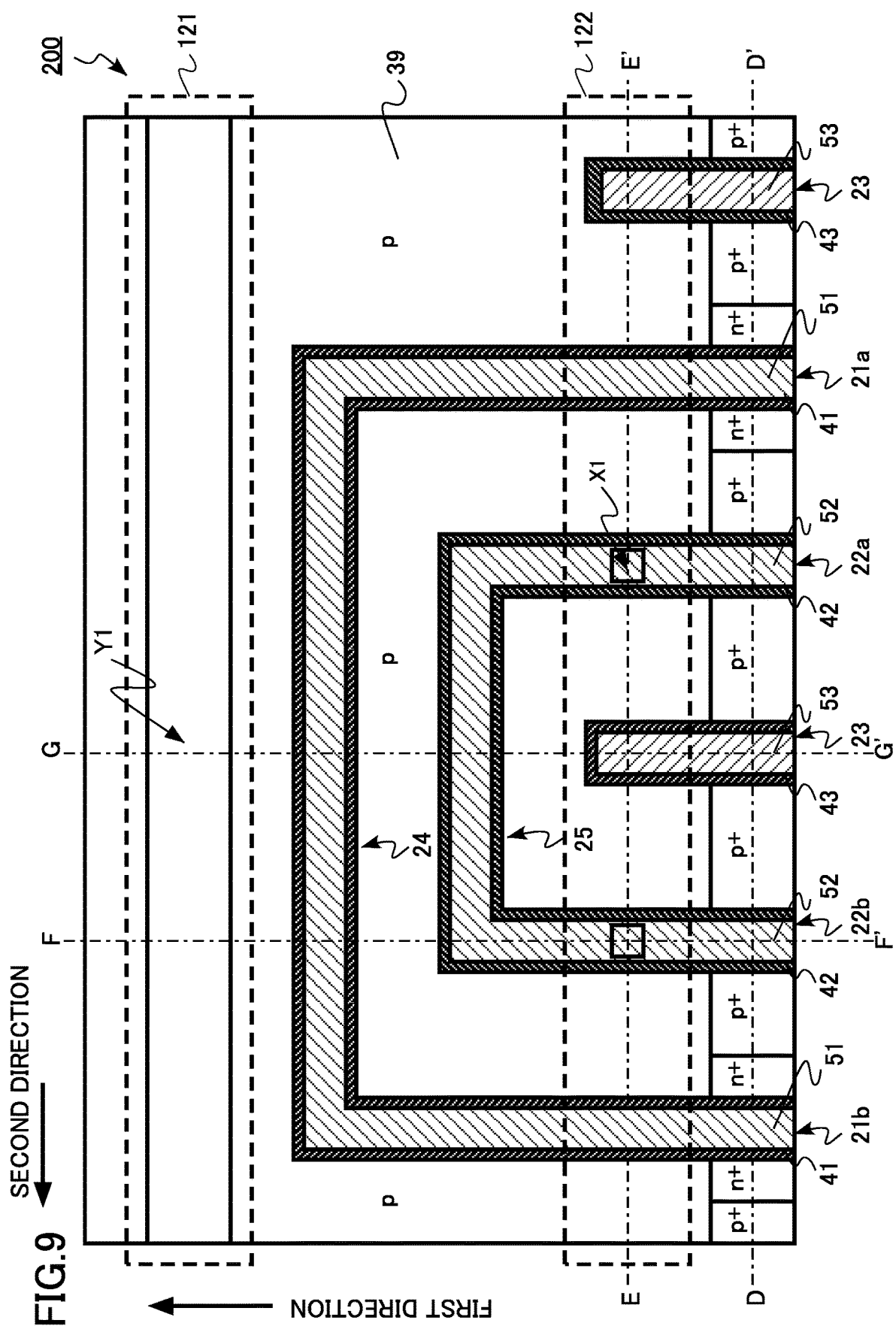
FIG. 9 is a top view schematically illustrating the portion of the semiconductor device in the second embodiment.
Figure 10:
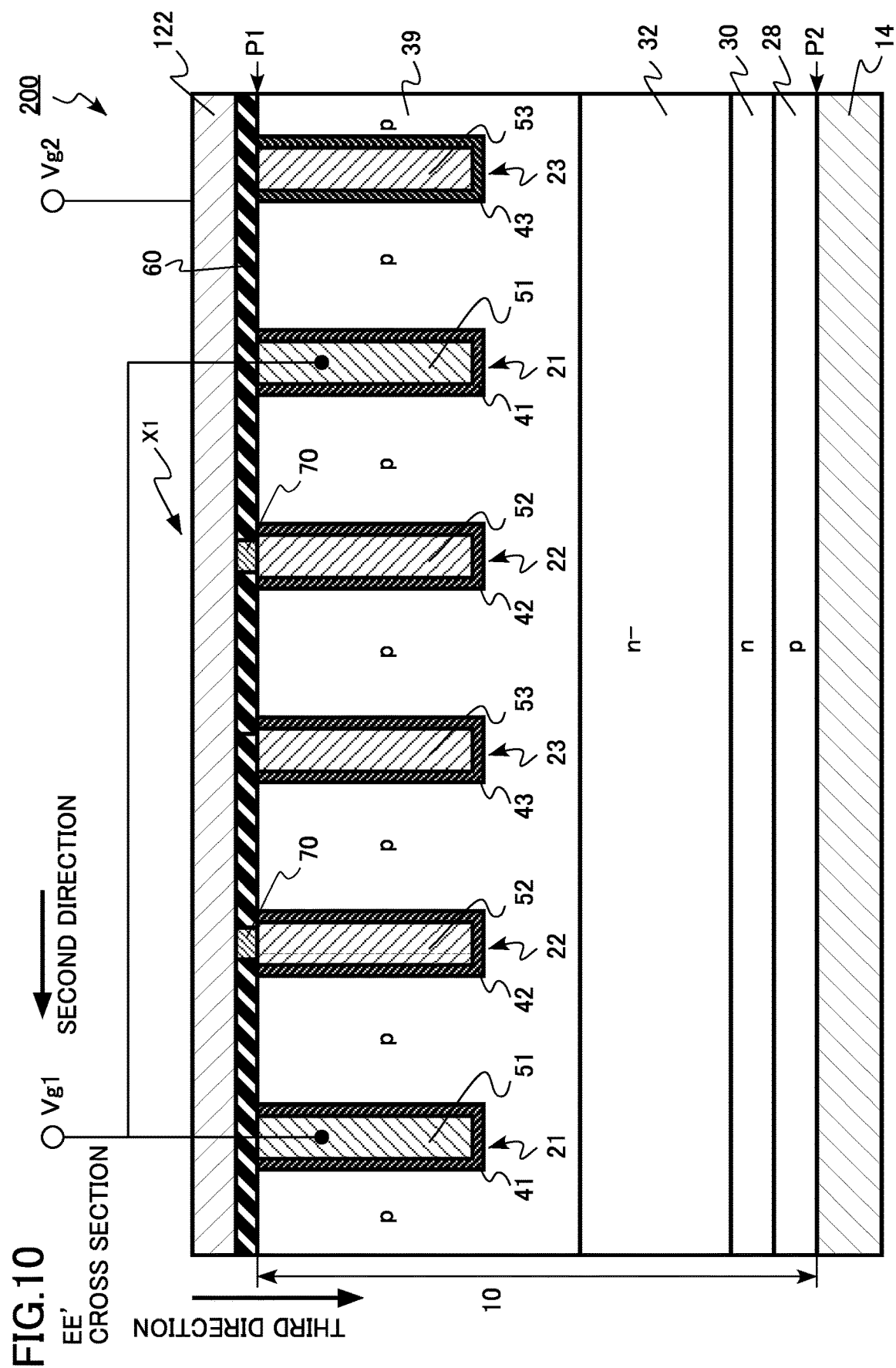
FIG. 10 is a cross-sectional view schematically illustrating the portion of the semiconductor device in the second embodiment.
Figure 11:
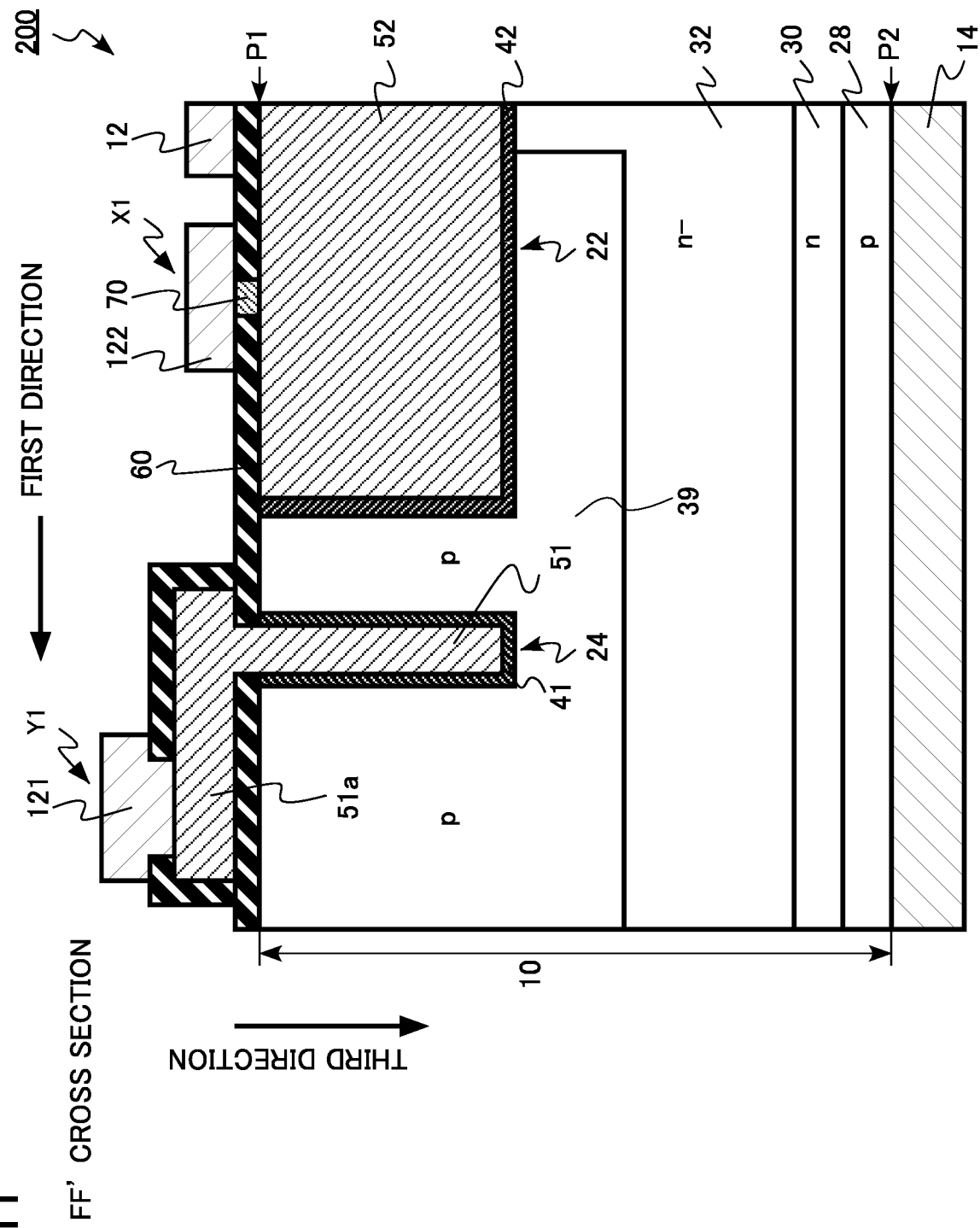
FIG. 11 is a cross-sectional view schematically illustrating the portion of the semiconductor device in the second embodiment.
Figure 12:
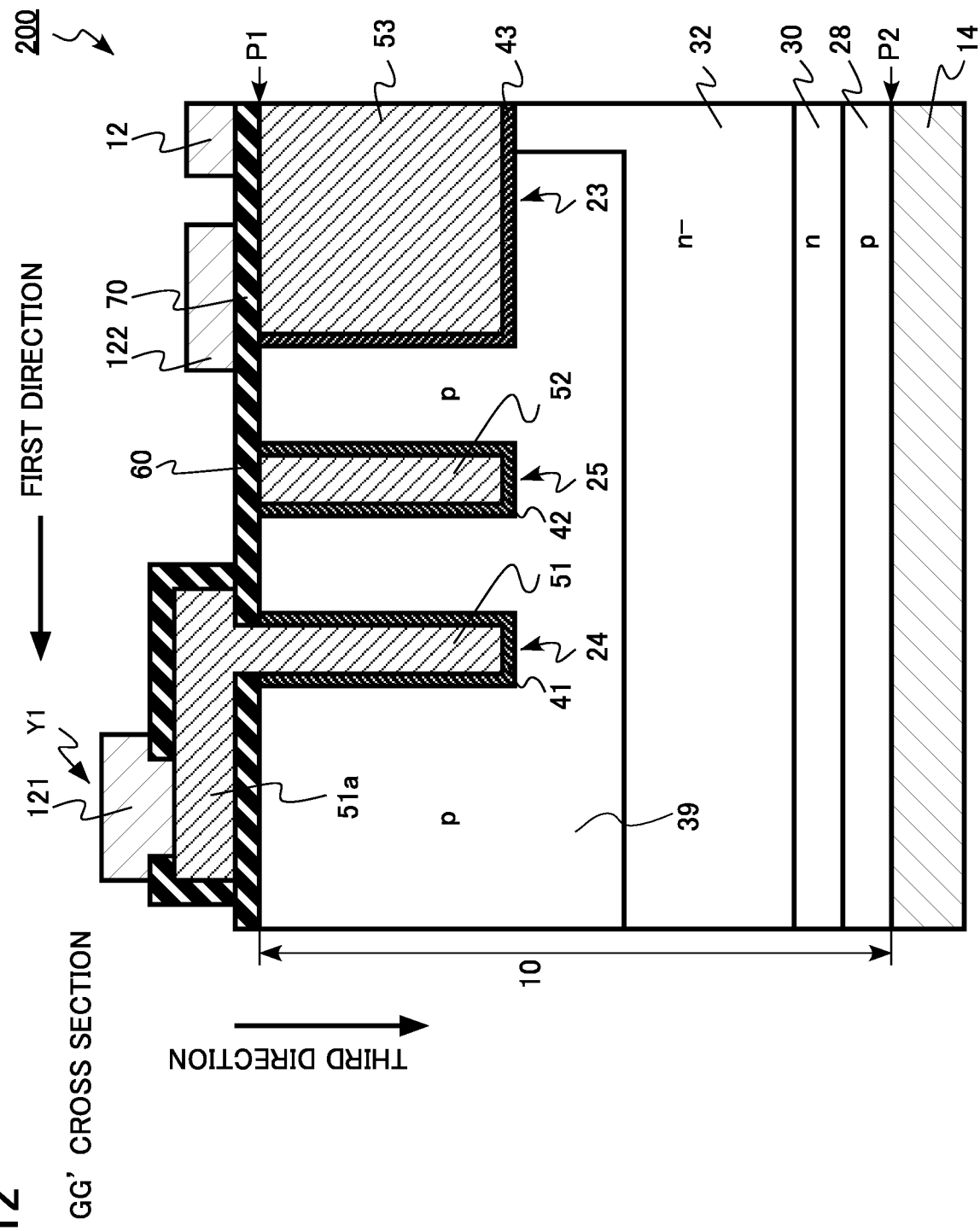
FIG. 12 is a cross-sectional view schematically illustrating the portion of the semiconductor device in the second embodiment.

FIG. 8 is a cross-sectional view schematically illustrating a portion of the semiconductor device in the second embodiment. FIG. 9 is a top view schematically illustrating the portion of the semiconductor device in the second embodiment. FIG. 10 is a cross-sectional view schematically illustrating the portion of the semiconductor device in the second embodiment. FIG. 11 is a cross-sectional view schematically illustrating the portion of the semiconductor device in the second embodiment. FIG. 12 is a cross-sectional view schematically illustrating the portion of the semiconductor device in the second embodiment.

FIGS. 8 to 12 are enlarged view illustrating a region R surrounded by a dotted frame in FIG. 7. The region R is a boundary region between the cell region 101 and the cell end region 102.

FIG. 8 illustrates a cross-section taken long line DD' in FIG. 9. FIG. 8 illustrates a cross-section of the cell region 101.

FIG. 10 illustrates a cross-section taken long line EE' in FIG. 9. FIG. 10 illustrates a cross-section of the cell end region 102.

FIG. 11 illustrates a cross-section taken long line FF' in FIG. 9. FIG. 11 illustrates a cross-section of the cell region 101 and the cell end region 102.

FIG. 12 illustrates a cross-section taken long line GG' in FIG. 9. FIG. 12 illustrates a cross-section of the cell region 101 and the cell end region 102.

A second connection trench 25 is provided in the semiconductor layer 10.

As illustrated in FIG. 7, two control gate trenches 22 adjacent to each other are connected to each other at both end portions by the second connection trench 25. For example, as illustrated in FIG. 9, a control gate trench 22a and a control gate trench 22b are connected to each other by the second connection trench 25 in the region R including the end portion of the cell region 101 in the first direction. The control gate trench 22a and the control gate trench 22b are similarly connected to each other at the end portion of the cell region 101 on an opposite side of the first direction, by the second connection trench 25.

The main gate electrode 51 is connected to the main gate wiring 121 at an end portion of the main gate electrode 51 in the first direction. The main gate electrode 51 is connected to the main gate wiring 121 at an end portion of the main gate electrode 51 in an opposite direction of the first direction. The main gate electrode 51 is connected to the main gate wiring 121 at both end portions.

In FIG. 7, black circles on the main gate wiring 121 indicate positions at which the main gate wiring 121 is connected to the main gate electrode 51. For example, the main gate wiring 121 is connected to the main gate electrode 51 at a position (third position) Y1 in FIG. 7. The position Y1 corresponds to the end portion of the main gate electrode 51 in the first direction. For example, the main gate wiring 121 is connected to the main gate electrode 51 at a position (fourth position) Y2 in FIG. 7. The position Y2 corresponds to the end portion of the main gate electrode 51 in the opposite direction of the first direction.

The main gate wiring 121 is connected to the main gate electrode 51 on both the sides of the main gate trench 21 in the first direction and the opposite direction of the first direction.

As illustrated in FIG. 12, the main gate electrode 51 in the first connection trench 24 includes a lead region 51a. The lead region 51a is provided on the first plane P1. The main gate wiring 121 is in contact with the lead region 51a at the position (third position) Y1.

The control gate electrode 52 is connected to the control gate wiring 122 at an end portion of the control gate electrode 52 in the first direction. The control gate electrode 52 is connected to the control gate wiring 122 at an end portion of the control gate electrode 52 in the opposite direction of the first direction.

In FIG. 7, black circles on the control gate wiring 122 indicate positions at which the control gate wiring 122 is connected to the control gate electrode 52. The control gate electrode 52 in the control gate trench 22 between two main gate trenches 21 is connected to the control gate wiring 122 at a position between the two main gate trenches 21.

The control gate wiring 122 is connected to the control gate electrode 52 at a position (first position) X1 in FIG. 7, for example. The position X1 corresponds to the end portion of the control gate electrode 52 in the first direction. The control gate wiring 122 is connected to the control gate electrode 52 at a position (second position) X2 in FIG. 7, for example. The position X2 corresponds to the end portion of the control gate electrode 52 in the opposite direction of the first direction.

As illustrated in FIG. 9, for example, the control gate electrode 52 in the control gate trench 22a is connected to the control gate wiring 122 at the position X1 between the main gate trench 21a and the main gate trench 21b. The position X1 is a position at which the control gate wiring 122 intersects with the control gate trench 22a.

As illustrated in FIGS. 10 and 11, the control gate wiring 122 is connected to the control gate electrode 52 in the control gate trench 22a by using the contact plug 70. For example, the contact plug 70 is formed by burying a hole provided in the interlayer insulating layer 60 on the control gate electrode 52.

The material of the contact plug 70 is different from the material of the control gate wiring 122, for example. As the material of the contact plug 70, a material having burying ability for a small hole better than the material of the control gate wiring 122 is used. For example, the material of the control gate wiring 122 is an aluminum alloy, and the material of the contact plug 70 is tungsten.

The contact plug 70 is in contact with the control gate electrode 52. The contact plug 70 is in contact with the control gate wiring 122.

The width of the contact plug 70 in the second direction is smaller than the width of the control gate electrode 52 in the second direction.

The control gate wiring 122 intersects with the main gate trench 21.

In the IGBT 200 in the second embodiment, a ring-like trench is formed by the control gate trench 22a, the control gate trench 22b, and the second connection trench 25. Since both end portions of the two control gate trenches 22 adjacent to each other are connected to each other, the electric field strength at the end portion of the control gate trench 22 is reduced, and the gate insulating breakdown voltage of the IGBT 200 is increased.

According to the second embodiment, it is possible to reduce the on-resistance of the IGBT and to reduce the switching loss of the IGBT. The degree of freedom in pattern design of the IGBT increases. It is possible to reduce the chip area of the IGBT. An operation speed of the IGBT is increased. The reliability of the IGBT is improved.

Third Embodiment

A semiconductor device according to a third embodiment is different from the semiconductor device in the first embodiment in that the second gate electrode includes a lead region, and the second wiring is connected to the lead region. Some of descriptions of contents similar to the contents in the first embodiment will be omitted below.

The semiconductor device in the third embodiment is an IGBT 300. The IGBT 300 is a trench gate type IGBT including a gate electrode in a trench formed in a semiconductor layer. The IGBT 300 is capable of double gate driving.

Figure 13:
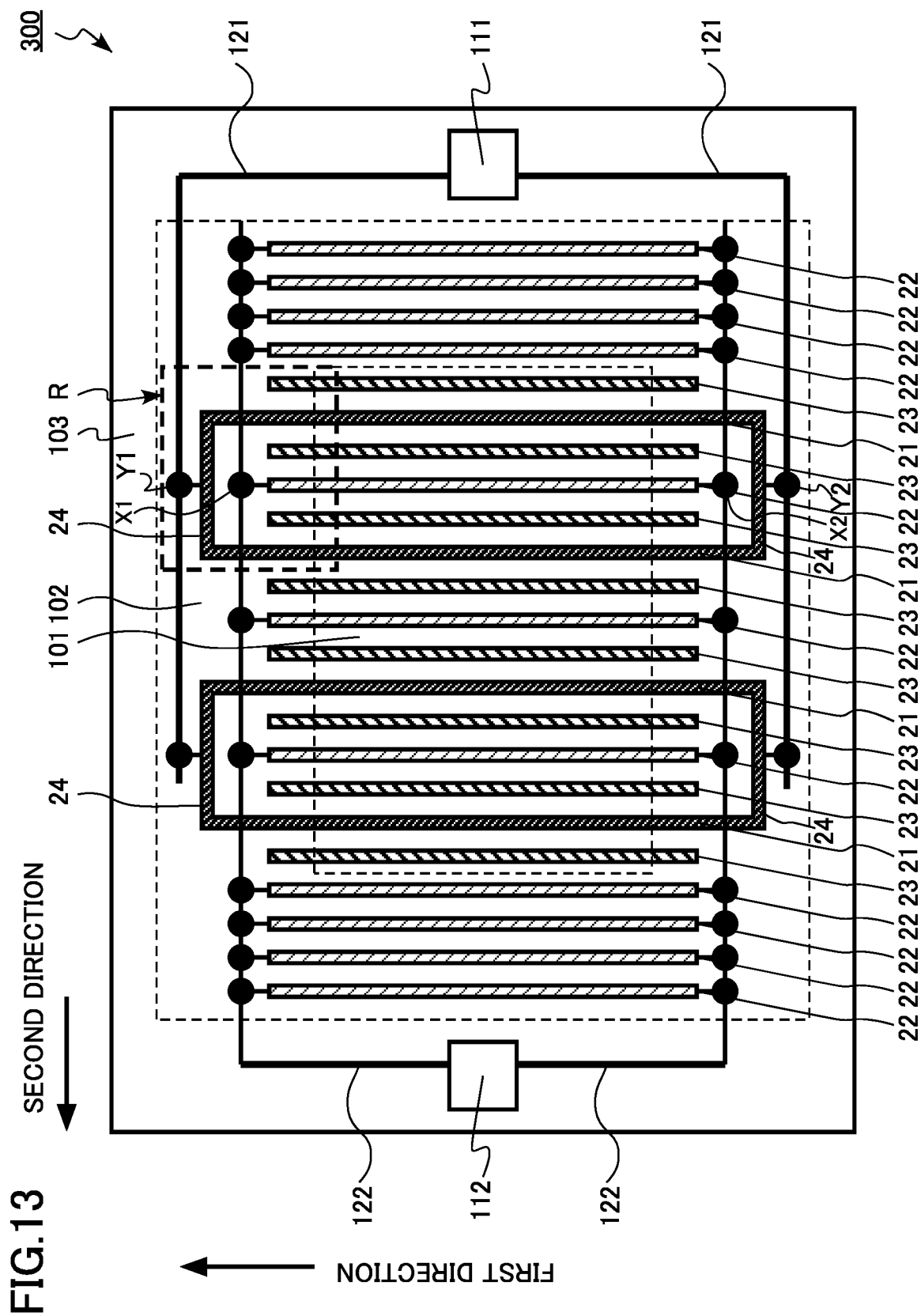
FIG. 13 is a schematic diagram illustrating a semiconductor device according to a third embodiment.

FIG. 13 is a schematic diagram illustrating the semiconductor device in the third embodiment. FIG. 13 illustrates a positional relation and a connection relation between the first trench, the second trench, the first gate electrode pad, the second gate electrode pad, the first wiring, and the second wiring.

Figure 14:
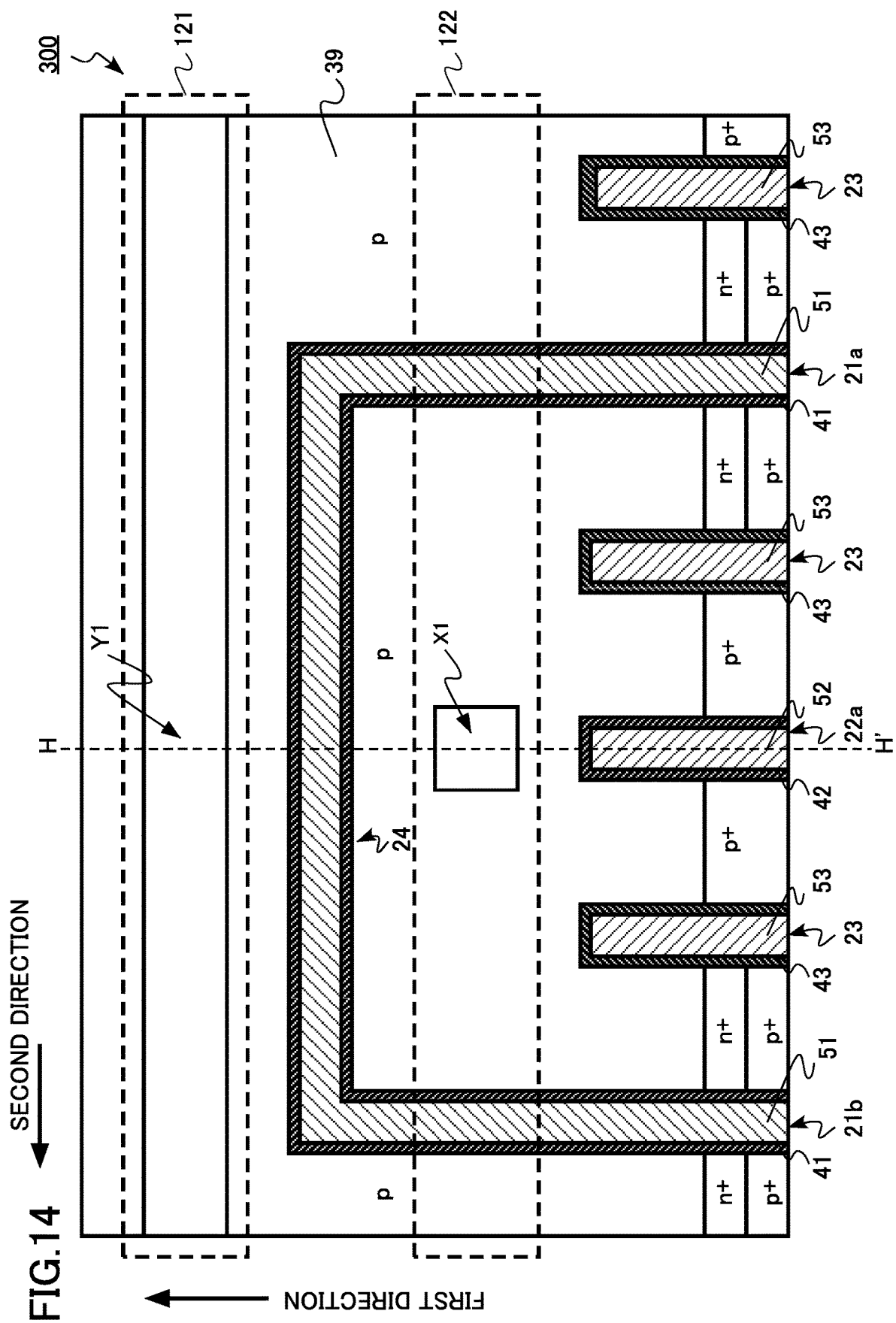
FIG. 14 is a top view schematically illustrating a portion of the semiconductor device in the third embodiment.
Figure 15:
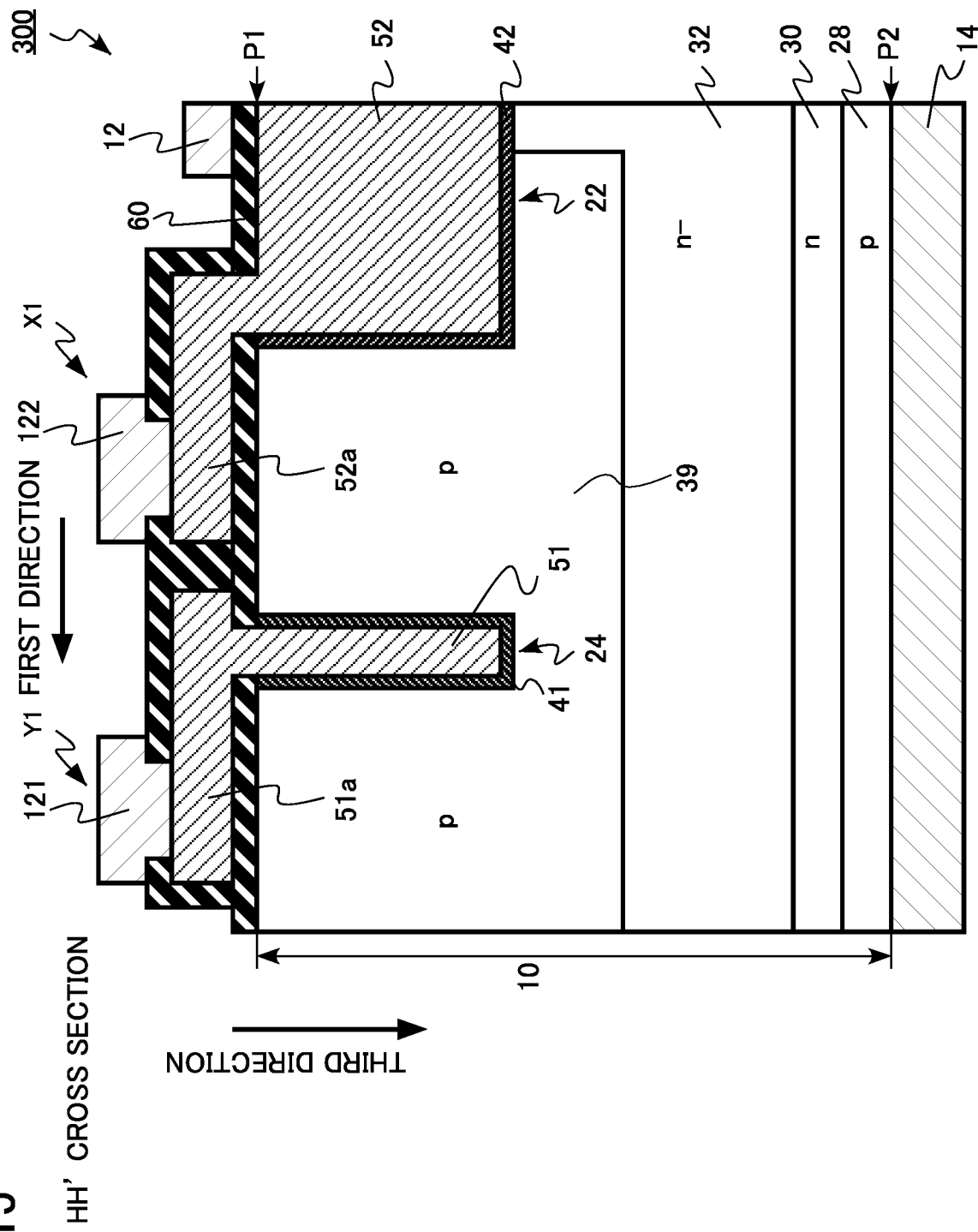
FIG. 15 is a cross-sectional view schematically illustrating a portion of the semiconductor device in the third embodiment.

FIG. 14 is a top view schematically illustrating a portion of the semiconductor device in the third embodiment. FIG. 15 is a cross-sectional view schematically illustrating the portion of the semiconductor device in the third embodiment.

FIGS. 14 and 15 are enlarged view illustrating a region R surrounded by a dotted frame in FIG. 13. The region R is a boundary region between the cell region 101 and the cell end region 102.

FIG. 15 illustrates a cross-section taken long line HH' in FIG. 14. FIG. 14 illustrates a cross-section of the cell region 101 and the cell end region 102.

The control gate electrode 52 in the IGBT 300 includes a lead region 52a.

The main gate electrode 51 is connected to the main gate wiring 121 at an end portion of the main gate electrode 51 in the first direction. The main gate electrode 51 is connected to the main gate wiring 121 at an end portion of the main gate electrode 51 in an opposite direction of the first direction. The main gate electrode 51 is connected to the main gate wiring 121 at both end portions.

In FIG. 13, black circles on the main gate wiring 121 indicate positions at which the main gate wiring 121 is connected to the main gate electrode 51. For example, the main gate wiring 121 is connected to the main gate electrode 51 at a position (third position) Y1 in FIG. 13. The position Y1 corresponds to the end portion of the main gate electrode 51 in the first direction. For example, the main gate wiring 121 is connected to the main gate electrode 51 at a position (fourth position) Y2 in FIG. 13. The position Y2 corresponds to the end portion of the main gate electrode 51 in the opposite direction of the first direction.

The main gate wiring 121 is connected to the main gate electrode 51 on both the sides of the main gate trench 21 in the first direction and the opposite direction of the first direction.

As illustrated in FIG. 15, the main gate electrode 51 in the first connection trench 24 includes the lead region 51a. The lead region 51a is provided on the first plane P1. The main gate wiring 121 is in contact with the lead region 51a at the position (third position) Y1.

The control gate electrode 52 is connected to the control gate wiring 122 at an end portion of the control gate electrode 52 in the first direction. The control gate electrode 52 is connected to the control gate wiring 122 at an end portion of the control gate electrode 52 in the opposite direction of the first direction.

In FIG. 13, black circles on the control gate wiring 122 indicate positions at which the control gate wiring 122 is connected to the control gate electrode 52. The control gate electrode 52 between two main gate trenches 21 is connected to the control gate wiring 122 at a position between the two main gate trenches 21.

The control gate wiring 122 is connected to the control gate electrode 52 at a position (first position) X1 in FIG. 13, for example. The position X1 corresponds to the end portion of the control gate electrode 52 in the first direction. The control gate wiring 122 is connected to the control gate electrode 52 at a position (second position) X2 in FIG. 13, for example. The position X2 corresponds to the end portion of the control gate electrode 52 in the opposite direction of the first direction.

The control gate wiring 122 is connected to the control gate electrode 52 at a position spaced from the control gate trench 22. The control gate wiring 122 does not intersect with the control gate trench 22.

As illustrated in FIG. 15, the control gate electrode 52 includes the lead region 52a. The lead region 52a is provided on the first plane P1. The control gate wiring 122 is connected to the lead region 52a at the position (first position) X1.

In the IGBT 300 in the third embodiment, microfabrication is not required for processing the connection between the control gate wiring 122 and the control gate electrode 52. Thus, it is easy to manufacture the IGBT 300.

According to the third embodiment, it is possible to reduce the on-resistance of the IGBT and to reduce the switching loss. The degree of freedom in pattern design of the IGBT increases. It is possible to reduce the chip area of the IGBT. An operation speed of the IGBT is increased. The reliability of the IGBT is improved. It is easy to manufacture the IGBT.

Fourth Embodiment

A semiconductor device according to a fourth embodiment is different from the semiconductor device in the second embodiment in that the second connection trench is interposed in the second semiconductor region. Some of descriptions of contents similar to the contents in the first embodiment and the third embodiment will be omitted below.

The semiconductor device in the fourth embodiment is an IGBT 400. The IGBT 400 is a trench gate type IGBT including a gate electrode in a trench formed in a semiconductor layer. The IGBT 400 is capable of double gate driving.

Figure 16:
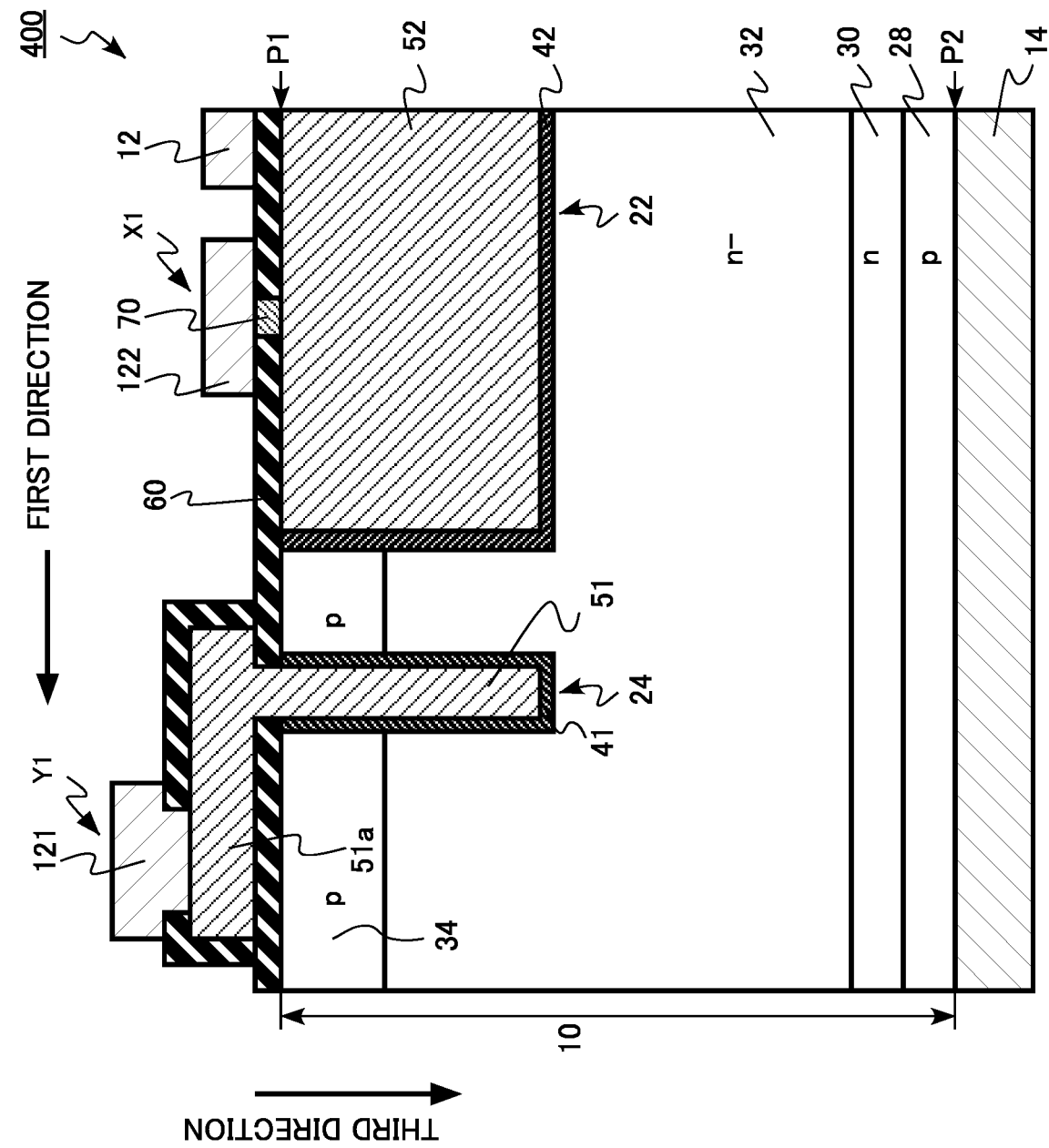
FIG. 16 is a cross-sectional view schematically illustrating a portion of a semiconductor device according to a fourth embodiment.

FIG. 16 is a cross-sectional view schematically illustrating a portion of the semiconductor device in the fourth embodiment. FIG. 16 is a diagram corresponding to FIG. 11 in the second embodiment.

Figure 17:
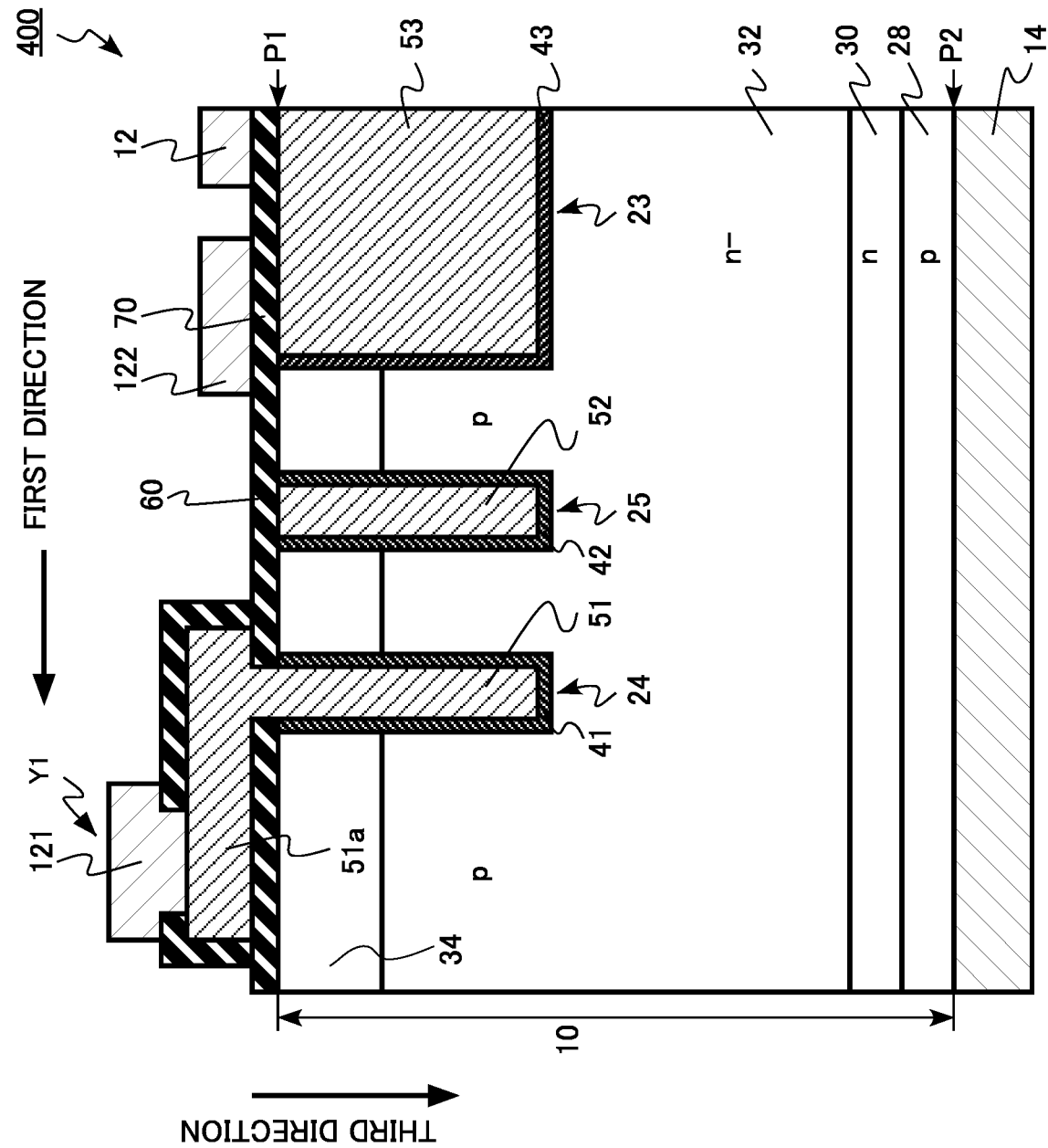
FIG. 17 is a cross-sectional view schematically illustrating a portion of the semiconductor device in the fourth embodiment.

FIG. 17 is a cross-sectional view schematically illustrating the portion of the semiconductor device in the fourth embodiment. FIG. 17 is a diagram corresponding to FIG. 12 in the second embodiment.

In the IGBT 400, the deep region 39 is not provided in the semiconductor layer 10. The base region 34 is provided in the semiconductor layer 10 in the cell end region 102.

In the IGBT 400, the first connection trench 24 is interposed in the drift region 32. In the IGBT 400, the second connection trench 25 is interposed in the drift region 32.

In the IGBT 400 in the fourth embodiment, forming a deep deep region 39 is not required. Thus, it is easy to manufacture the IGBT 400.

According to the fourth embodiment, it is possible to reduce the on-resistance of the IGBT and to reduce the switching loss. The degree of freedom in pattern design of the IGBT increases. It is possible to reduce the chip area of the IGBT. An operation speed of the IGBT is increased. The reliability of the IGBT is improved. It is easy to manufacture the IGBT.

Fifth Embodiment

A semiconductor device according to a fifth embodiment is different from the semiconductor device in the first embodiment in that the first wiring and the first gate electrode are connected to each other with a conductive layer having a material different from the material of the first wiring. Some of descriptions of contents similar to the contents in the first embodiment will be omitted below.

The semiconductor device in the fifth embodiment is an IGBT 500. The IGBT 500 is a trench gate type IGBT including a gate electrode in a trench formed in a semiconductor layer. The IGBT 500 is capable of double gate driving.

Figure 18:
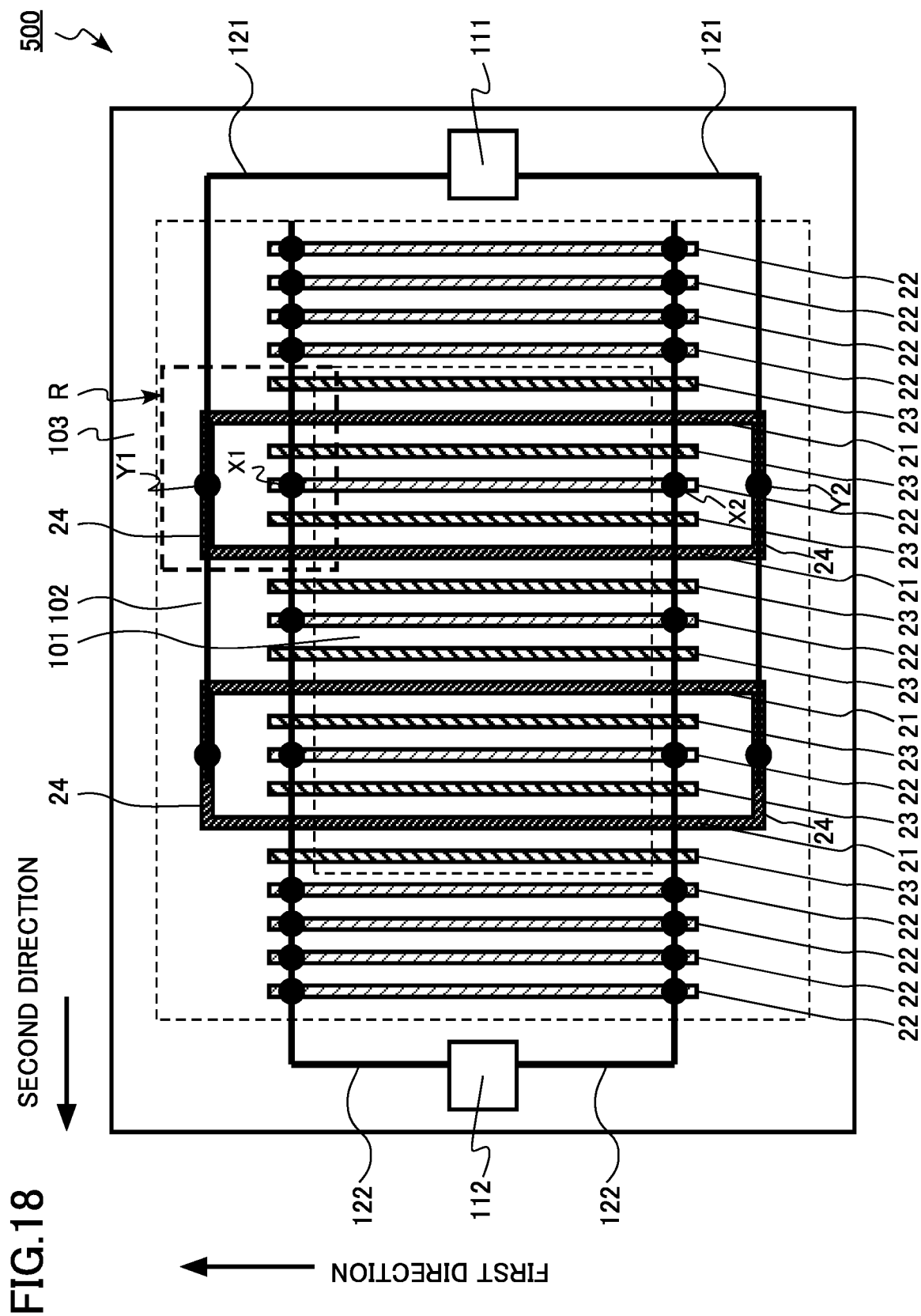
FIG. 18 is a schematic diagram illustrating a semiconductor device according to a fifth embodiment.

FIG. 18 is a schematic diagram illustrating the semiconductor device in the fifth embodiment. FIG. 18 illustrates a positional relation and a connection relation between the first trench, the second trench, the first gate electrode pad, the second gate electrode pad, the first wiring, and the second wiring.

Figure 19:
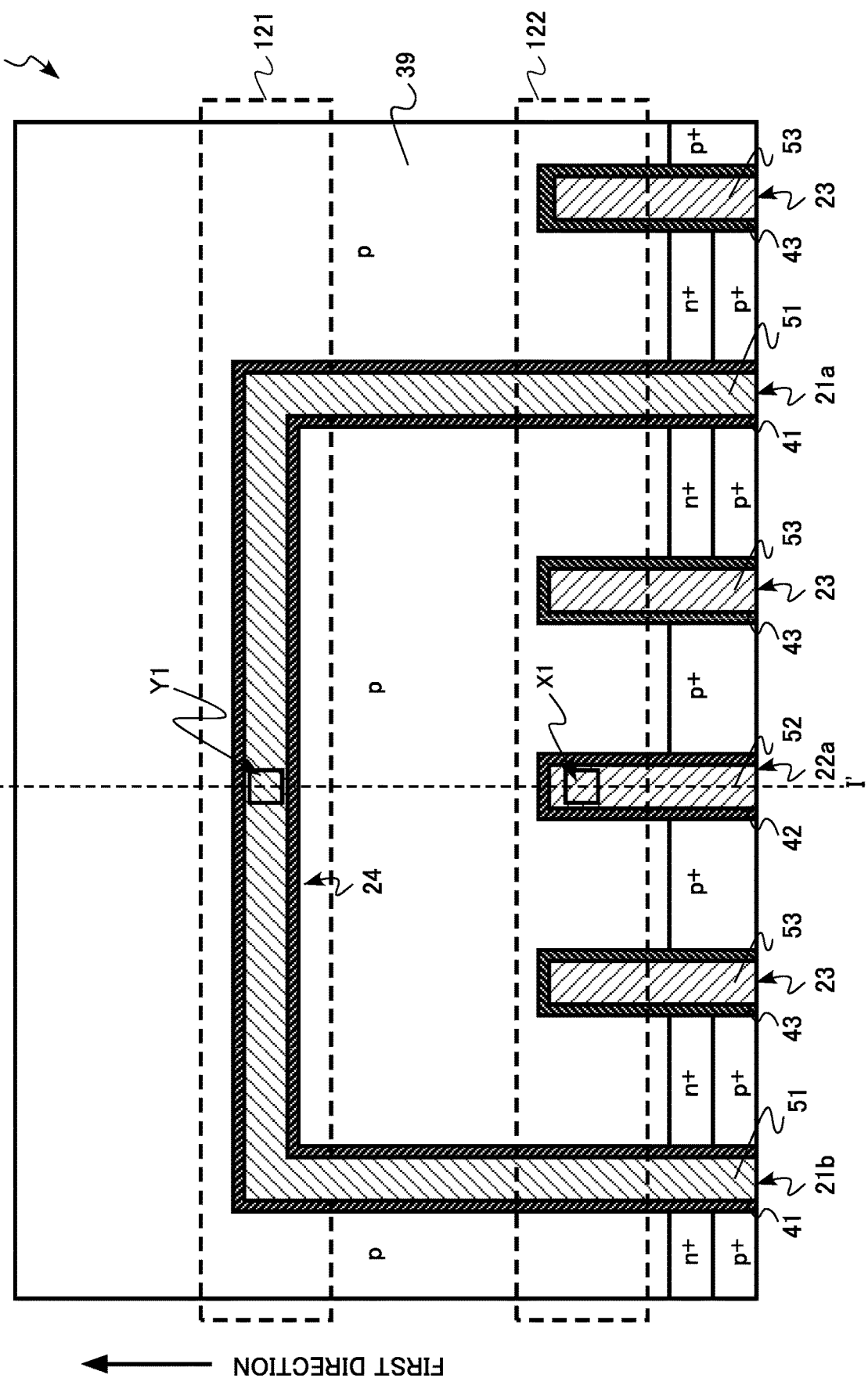
FIG. 19 is a top view schematically illustrating a portion of the semiconductor device in the fifth embodiment.
Figure 20:
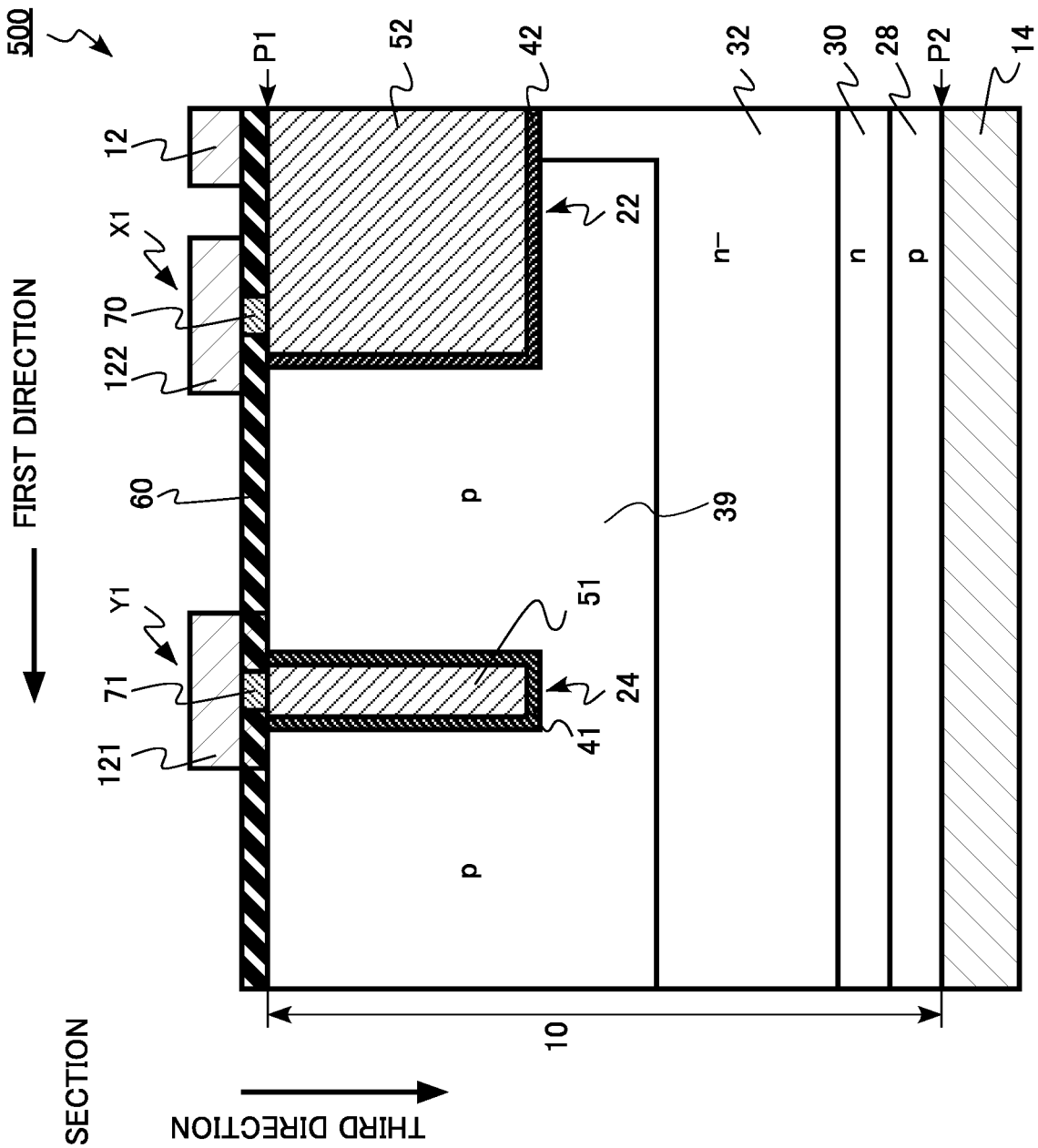
FIG. 20 is a cross-sectional view schematically illustrating the portion of the semiconductor device in the fifth embodiment.

FIG. 19 is a top view schematically illustrating a portion of the semiconductor device in the fifth embodiment. FIG. 20 is a cross-sectional view schematically illustrating the portion of the semiconductor device in the fifth embodiment.

FIGS. 19 and 20 are enlarged view illustrating a region R surrounded by a dotted frame in FIG. 18. The region R is a boundary region between the cell region 101 and the cell end region 102.

FIG. 20 illustrates a cross-section taken long line II' in FIG. 19. FIG. 20 illustrates a cross-section of the cell region 101 and the cell end region 102.

The IGBT 500 includes a contact plug 71.

The main gate electrode 51 is connected to the main gate wiring 121 at an end portion of the main gate electrode 51 in the first direction. The main gate electrode 51 is connected to the main gate wiring 121 at an end portion of the main gate electrode 51 in an opposite direction of the first direction. The main gate electrode 51 is connected to the main gate wiring 121 at both end portions.

In FIG. 18, black circles on the main gate wiring 121 indicate positions at which the main gate wiring 121 is connected to the main gate electrode 51. For example, the main gate wiring 121 is connected to the main gate electrode 51 at a position (third position) Y1 in FIG. 18. The position Y1 corresponds to the end portion of the main gate electrode 51 in the first direction. The position Y1 is a position at which the first connection trench 24 intersects with the main gate wiring 121.

For example, the main gate wiring 121 is connected to the main gate electrode 51 at a position (fourth position) Y2 in FIG. 18. The position Y2 corresponds to the end portion of the main gate electrode 51 in the opposite direction of the first direction. The position Y2 is a position at which the first connection trench 24 intersects with the main gate wiring 121.

The main gate wiring 121 is connected to the main gate electrode 51 on both the sides of the main gate trench 21 in the first direction and the opposite direction of the first direction.

As illustrated in FIG. 20, the main gate wiring 121 is connected to the main gate electrode 51 in the first connection trench 24 by using the contact plug 71. For example, the contact plug 71 is formed by burying a hole provided in the interlayer insulating layer 60 on the main gate electrode 51.

The material of the contact plug 71 is different from the material of the main gate wiring 121. As the material of the contact plug 71, a material having burying ability for a small hole better than the material of the main gate wiring 121 is used. For example, the material of the main gate wiring 121 is an aluminum alloy, and the material of the contact plug 71 is tungsten.

The contact plug 71 is in contact with the main gate electrode 51. The contact plug 71 is in contact with the main gate wiring 121.

The width of the contact plug 71 in the first direction is smaller than the width of the main gate electrode 51 in the first direction.

The control gate electrode 52 is connected to the control gate wiring 122 at an end portion of the control gate electrode 52 in the first direction. The control gate electrode 52 is connected to the control gate wiring 122 at an end portion of the control gate electrode 52 in the opposite direction of the first direction.

In FIG. 18, black circles on the control gate wiring 122 indicate positions at which the control gate wiring 122 is connected to the control gate electrode 52. The control gate electrode 52 in the control gate trench 22 between two main gate trenches 21 is connected to the control gate wiring 122 at a position between the two main gate trenches 21.

The control gate wiring 122 is connected to the control gate electrode 52 at a position (first position) X1 in FIG. 18, for example. The position X1 corresponds to the end portion of the control gate electrode 52 in the first direction. The control gate wiring 122 is connected to the control gate electrode 52 at a position (second position) X2 in FIG. 18, for example. The position X2 corresponds to the end portion of the control gate electrode 52 in the opposite direction of the first direction.

As illustrated in FIG. 19, for example, the control gate electrode 52 in the control gate trench 22a is connected to the control gate wiring 122 at the position X1 between the main gate trench 21a and the main gate trench 21b. The position X1 is a position at which the control gate wiring 122 intersects with the control gate trench 22a.

As illustrated in FIG. 20, the control gate wiring 122 is connected to the control gate electrode 52 in the control gate trench 22a by using the contact plug 70. For example, the contact plug 70 is formed by burying a hole provided in the interlayer insulating layer 60 on the control gate electrode 52.

The material of the contact plug 70 is different from the material of the control gate wiring 122, for example. As the material of the contact plug 70, a material having burying ability for a small hole better than the material of the control gate wiring 122 is used. For example, the material of the control gate wiring 122 is an aluminum alloy, and the material of the contact plug 70 is tungsten.

The contact plug 70 is in contact with the control gate electrode 52. The contact plug 70 is in contact with the control gate wiring 122.

The width of the contact plug 70 in the second direction is smaller than the width of the control gate electrode 52 in the second direction.

In the IGBT 500 in the fifth embodiment, the contact plug 71 is used for the connection between the main gate wiring 121 and the main gate electrode 51. Thus, it is possible to reduce the area required for the connection between the main gate wiring 121 and the main gate electrode 51. Accordingly, it is possible to reduce a chip area of the IGBT 500.

According to the fifth embodiment, it is possible to reduce the on-resistance of the IGBT and to reduce the switching loss. The degree of freedom in pattern design of the IGBT increases. It is possible to reduce the chip area of the IGBT. An operation speed of the IGBT is increased. The reliability of the IGBT is improved. It is easy to manufacture the IGBT.

In the first to fifth embodiments, a case where the semiconductor layer is made of single crystal silicon is described as an example. However, the material of the semiconductor layer is not limited to single crystal silicon. For example, other single crystal semiconductors such as single crystal silicon carbide may be provided.

In the first to fifth embodiments, a case where the first conductive type is the p-type, and the second conductive type is the n-type is described as an example. However, the first conductive type may be set to the n-type, and the second conductive type may be set to the p-type. When the first conductive type is set to the n-type, and the second conductive type is set to the p-type, for example, the second voltage (V2) is the positive voltage.

The arrangement and the ratio of the main gate trench 21, the control gate trench 22, and the dummy gate trench 23 are not limited to the arrangement and the ratio in the first to fifth embodiments.

While certain embodiments have been described, these embodiments have been presented by way of example only, and are not intended to limit the scope of the inventions. Indeed, the semiconductor device and the semiconductor circuit described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
 a semiconductor layer including a first plane and a second plane, the first plane being parallel to a first direction and a second direction perpendicular to the first direction, and the second plane facing the first plane, and the semiconductor layer including
 a first semiconductor region having a first conductive type,
 a second semiconductor region having a second conductive type and being provided between the first semiconductor region and the first plane,
 a third semiconductor region having the first conductive type and being provided between the second semiconductor region and the first plane,
 a fourth semiconductor region having the second conductive type and being provided between the third semiconductor region and the first plane,
 a plurality of first trenches extending in the first direction, being repetitively disposed in the second direction, and having a distance from the second plane, the distance being smaller than a distance from the second plane to the third semiconductor region, and
 a plurality of second trenches extending in the first direction, being repetitively disposed in the second direction, and having a distance from the second plane, the distance being smaller than a distance from the second plane to the third semiconductor region;
 a first gate electrode provided in each of the first trenches;
 a first gate insulating film provided between the first gate electrode and the third semiconductor region and between the first gate electrode and the fourth semiconductor region, the first gate insulating film being in contact with the fourth semiconductor region;
 a second gate electrode provided in each of the second trenches;
 a second gate insulating film provided between the second gate electrode and the third semiconductor region;
 a first electrode provided on the first plane side of the semiconductor layer, the first electrode being electrically connected to the fourth semiconductor region;
 a second electrode provided on the second plane side of the semiconductor layer, the second electrode being electrically connected to the first semiconductor region;

a first gate electrode pad provided on the first plane side of the semiconductor layer, a first gate voltage being applied to the first gate electrode pad;
a second gate electrode pad provided on the first plane side of the semiconductor layer, a second gate voltage being applied to the second gate electrode pad;
a first wiring electrically connecting the first gate electrode pad and the first gate electrode; and
a second wiring electrically connecting the second gate electrode pad and the second gate electrode,
wherein the semiconductor layer includes a first connection trench,
two of the first trenches adjacent to each other are connected to each other at end portions by the first connection trench, and
the second gate electrode in at least one of the second trenches is electrically connected to the second wiring at a first position.

2. The semiconductor device according to claim 1, wherein the first position is an end portion of the second gate electrode in the at least one of the second trenches in the first direction.

3. The semiconductor device according to claim 2, wherein the second gate electrode in the at least one of the second trenches is electrically connected to the second wiring at a second position being an end portion in an opposite direction of the first direction.

4. The semiconductor device according to claim 1, wherein the first position is a position at which the second wiring intersects with the at least one of the second trenches.

5. The semiconductor device according to claim 1, wherein the first gate electrode is electrically connected to the first wiring at a third position being an end portion in the first direction.

6. The semiconductor device according to claim 5, wherein the first gate electrode is electrically connected to the first wiring at a fourth position being an end portion in an opposite direction of the first direction.

7. The semiconductor device according to claim 1, wherein the second wiring and the second gate electrode are connected with a conductive layer having a material different from a material of the second wiring.

8. The semiconductor device according to claim 7, wherein a width of the conductive layer in the second direction is smaller than a width of the second gate electrode in the second direction.

9. The semiconductor device according to claim 1, wherein the semiconductor layer includes a second connection trench, and
the at least one of the second trenches and another one of second trenches adjacent to the at least one of the second trenches are connected to each other at end portions by the second connection trench.

10. The semiconductor device according to claim 9, wherein the second connection trench is interposed in the second semiconductor region.

11. The semiconductor device according to claim 1, wherein a ratio of the number of the second trenches to the number of the first trenches in a first region and a second region located in the second direction of the first region is greater than the ratio in a third region interposed between the first region and the second region.

12. The semiconductor device according to claim 1, wherein the second wiring intersects with the first trenches.

13. The semiconductor device according to claim 1, wherein the semiconductor layer includes a fifth semiconductor region of the first conductive type between the first connection trench and the second semiconductor region.

14. The semiconductor device according to claim 13, wherein the fifth semiconductor region is provided between the first position and the second semiconductor region.

15. A semiconductor circuit comprising:
the semiconductor device according to claim 1; and
a control circuit configured to drive the semiconductor device and to change the second gate voltage from a first voltage to a second voltage before the first gate voltage is changed from a turn-on voltage to a turn-off voltage, the second voltage being a negative voltage when the first conductive type is a p-type and being a positive voltage when the first conductive type is an n-type.

16. The semiconductor device according to claim 1, wherein the first position is a position between two of the first trenches adjacent to each other.

17. A semiconductor device comprising:
a semiconductor layer including a first plane and a second plane, the first plane being parallel to a first direction and a second direction perpendicular to the first direction, and the second plane facing the first plane, and the semiconductor layer including
a first semiconductor region having a first conductive type,
a second semiconductor region having a second conductive type and being provided between the first semiconductor region and the first plane,
a third semiconductor region having the first conductive type and being provided between the second semiconductor region and the first plane,
a fourth semiconductor region having the second conductive type and being provided between the third semiconductor region and the first plane,
a plurality of first trenches extending in the first direction, being repetitively disposed in the second direction, and having a distance from the second plane, the distance being smaller than a distance from the second plane to the third semiconductor region, and
a plurality of second trenches extending in the first direction, being repetitively disposed in the second direction, and having a distance from the second plane, the distance being smaller than a distance from the second plane to the third semiconductor region;
a first gate electrode provided in each of the first trenches;
a first gate insulating film provided between the first gate electrode and the third semiconductor region and between the first gate electrode and the fourth semiconductor region, the first gate insulating film being in contact with the fourth semiconductor region;
a second gate electrode provided in each of the second trenches;
a second gate insulating film provided between the second gate electrode and the third semiconductor region;
a first electrode provided on the first plane side of the semiconductor layer, the first electrode being electrically connected to the fourth semiconductor region;
a second electrode provided on the second plane side of the semiconductor layer, the second electrode being electrically connected to the first semiconductor region;
a first gate electrode pad provided on the first plane side of the semiconductor layer, a first gate voltage being applied to the first gate electrode pad;

a second gate electrode pad provided on the first plane side of the semiconductor layer, a second gate voltage being applied to the second gate electrode pad;
a first wiring electrically connecting the first gate electrode pad and the first gate electrode; and
a second wiring electrically connecting the second gate electrode pad and the second gate electrode,
wherein a ratio of a number of the second trenches to a number of the first trenches in a first region is larger than a ratio of a number of the second trenches to a number of first trenches in a third region, a ratio of a number of the second trenches to a number of the first trenches in a second region is larger than the ratio of a number of the second trenches to a number of first trenches in the third region, and the third region is interposed between the first region and the second region in the second direction.

* * * * *